(12) United States Patent
Yokota et al.

(10) Patent No.: US 7,993,984 B2
(45) Date of Patent: Aug. 9, 2011

(54) ELECTRONIC DEVICE AND MANUFACTURING METHOD

(75) Inventors: Yasuo Yokota, Osaka (JP); Hisahiko Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 122 days.

(21) Appl. No.: 12/106,459

(22) Filed: Apr. 21, 2008

(65) Prior Publication Data

US 2009/0014873 A1  Jan. 15, 2009

(30) Foreign Application Priority Data

Jul. 13, 2007  (JP) ................................ 2007-183969
Aug. 1, 2007  (JP) ................................ 2007-200484
Sep. 13, 2007  (JP) ................................ 2007-237717

(51) Int. Cl.
*H01L 21/00* (2006.01)

(52) U.S. Cl. ............... 438/127; 257/795; 257/E23.127
(58) Field of Classification Search ................ 257/795, 257/E23.127; 438/127
See application file for complete search history.

(56) References Cited

U.S. PATENT DOCUMENTS

| 5,981,313 | A | 11/1999 | Tanaka |
| 6,335,571 | B1 * | 1/2002 | Capote et al. ............... 257/787 |
| 6,373,142 | B1 * | 4/2002 | Hoang ........................... 257/783 |
| 7,323,360 | B2 | 1/2008 | Gonzalez et al. |
| 2008/0308930 | A1 * | 12/2008 | Yoshida ......................... 257/737 |

FOREIGN PATENT DOCUMENTS

| JP | 2001-107019 | 4/2001 |
| JP | 2005-332970 | 12/2005 |
| JP | 2006-100457 | 4/2006 |

OTHER PUBLICATIONS

United States Office Action issued in U.S. Appl. No. 12/102,359, dated Jun. 17, 2010.
U.S. Final Office Action issued in U.S. Appl. No. 12/102,359, mailed on Sep. 23, 2010.
Related U.S. Appl. No. 12/102,359 to Yoshida, filed Apr. 14, 2008, entitled "Semiconductor Device Mounting Sturcture, Manufacturing Method, and Removal Method of Semiconductor Device".

* cited by examiner

*Primary Examiner* — Jenny L. Wagner
(74) *Attorney, Agent, or Firm* — McDermott Will & Emery LLP

(57) ABSTRACT

An electronic device including a semiconductor device with a plurality of bump electrodes, a mounting board connected to the semiconductor device, thermally expandable particles, and adhesive. The thermally expandable particles are provided on the sides of the semiconductor device and the surface of the mounting board around a projected area of the semiconductor device. The adhesive is provided on the sides of the semiconductor device and the surface of the mounting board such that it covers the area of thermally expandable particles. This improves the impact resistance of the semiconductor device soldered onto the mounting board, and also facilitates removal of the semiconductor device from the mounting board when the semiconductor device needs repair.

9 Claims, 18 Drawing Sheets

Drop direction

Drop direction ⇩

ELECTRONIC DEVICE AND MANUFACTURING METHOD

BACKGROUND OF THE INVENTION

1. Field of the Invention

The present invention relates to electronic devices equipped with a semiconductor device used for electronic equipment, typically mobile equipment requiring impact resistance, such as personal computers; and more particularly to electronic devices that show high drop impact resistance and ease of repair, and their manufacturing methods.

2. Background Art

FIG. 29 is a schematic sectional view of electronic device 551 in which conventional semiconductor device 502 with a ball grid array (hereinafter abbreviated to "BGA") is connected to mounting board 561. Bump electrodes 505 is formed on one face of semiconductor device 502. FIG. 30 is a schematic sectional view illustrating a state in which mounting board 561 of electronic device 551 is warped. When electronic device 551 is dropped, for example, after being mounted in electronic equipment such as a personal computer, stress is applied to mounting board 561, and mounting board 561 becomes warped. In line with the recent downsizing trend in equipment, bump electrodes 505 are becoming increasingly smaller due to demands for smaller semiconductor devices 502 to be mounted in equipment. If these pieces of equipment are dropped, warping or vibration is generated on mounting board 561 due to impact, and a peel force is applied between bump electrodes 505 and mounting board 561. This increases the risk of causing a crack or peeling on a boundary face between bump electrodes 505 and land (not illustrated) of mounting board 561.

To solve this advantage, Japanese Patent Unexamined Publication No. 2006-100457 proposes electronic device 552 that shows high impact resistance and also enables repair and reworking. More specifically, as shown in FIG. 31A, it proposes electronic device 552 that employs resin consisting of two layers for bonding semiconductor device 502 and mounting board 561. These two layers are layer 571 of peelable and removable resin and layer 572 of resin with high mechanical strength. Using this structure, if semiconductor device 502 needs to be replaced, such as for repair, it can be removed from mounting board 561 by heating peelable resin layer 571 until it becomes fluid.

However, since peelable and removable resin layer 571 is applied between semiconductor device 502 and mounting board 561 in a layer in electronic equipment 552 disclosed in Japanese Patent Unexamined Publication No. 2006-100457, resistance against impact such as drop impact is not sufficient. In addition, it is difficult to remove semiconductor device 502 from mounting board 561 without leaving any residue on mounting board 561, and then to re-connect new semiconductor device 561 immediately after removal in the repair process.

To solve these disadvantages, underfill 573, made of thermosetting resin, is injected in a space between mounting board 561 and semiconductor device 502, as shown in FIG. 31B, and cured so as to bond and fix semiconductor device 502 to mounting board 561. Alternatively, adhesive 574 in the form of thermosetting resin is applied around semiconductor device 502, as shown in FIG. 31C, and cured so as to bond and fix semiconductor device 502 to mounting board 561. If a failure is found in semiconductor device 502 with these structures and repairing is needed, cured underfill 573 or adhesive 574 used needs to be shaved off. This requires many man-hours.

On the other hand, Japanese Patent Unexamined Publication No. 2005-332970 discloses electronic device 555 that uses underfill 575 made of resin composite made by mixing organic thermally expandable particles 576 encapsulating an organic solvent and thermosetting adhesive resin.

In this electronic device 555, as configured above, in the repair process, the organic solvent in organic thermally expandable particles 576 in underfill 575 boils and evaporates on overheating electronic device 555. This changes the hardened resin material into a porous structure that permits semiconductor device 502 to be easily removed from mounting board 561.

However, according to the technology disclosed in Japanese Patent Unexamined Publication No. 2005-332970, microcapsules several micrometers in diameter are dispersed in low-viscosity liquid adhesive. It is thus extremely difficult to uniformly disperse thermally expandable particles 576, due to uneven distribution or sedimentation of microcapsules. In addition, to remove defective semiconductor device 502 from mounting board 561 by increasing the temperature of electronic device 555 to a temperature higher than the expansion temperature of thermally expandable particles 576, separation of semiconductor device 502 occurs at a boundary face of semiconductor device 502 and underfill 575 in addition to the boundary face of mounting board 561 and bump electrodes 505. This is because thermally expandable particles 576 are dispersed in the adhesive. In this case, a large portion of underfill 575 remains on mounting board 561 after removing semiconductor device 502, requiring many man-hours for removing this resin residue.

SUMMARY OF THE INVENTION

An electronic device of the present invention includes a semiconductor device with multiple connecting terminals, and a mounting board facing the semiconductor device and connected to the connecting terminals. Thermally expandable particles are provided at least on the sides of the semiconductor device or a surface of the mounting board around the projected area of the semiconductor device, and adhesive covers these thermally expandable particles.

With this structure, the electronic device of the present invention allows clear removal of the semiconductor device from a boundary face of the mounting board and adhesive by heating the electronic device to a temperature higher than an expansion temperature of the thermally expandable particles when any failure is found in the semiconductor device. Accordingly, a repair process becomes easy because only a small amount of adhesive residue remains on the mounting board after removing the semiconductor device.

A method of manufacturing the electronic device of the present invention includes the steps of electrically connecting the semiconductor device with multiple connecting terminals and the mounting board; and applying thermally expandable particles to at least the sides of the semiconductor device or the surface of the mounting board around the projected area of the semiconductor device and then applying adhesive such that it covers the thermally expandable particles.

This method enables the manufacture of the electronic device that shows high resistance to impact after the semiconductor device is mounted on the mounting board, and allows easy removable of the semiconductor device from the mounting board when repair or reworking is needed.

A method of removing the semiconductor device in an electronic device of the present invention includes the step of removing the semiconductor device bonded and fixed to the mounting board with curable resin by heating the thermally expandable particles to a temperature higher than the curing temperature of curable resin and not higher than a melting point of solder bump so as to thermally expand the thermally expandable particles. The electronic device includes the semiconductor device with electrodes aligned on its one main face, and the mounting board whose board electrodes are electrically connected to the electrodes of the semiconductor device by solder bumps. At least a part of the sides of the semiconductor device or a mounting board is bonded and fixed by curable resin. The thermally expandable particles are mixed in at least a part of the boundary face of the curable resin and the mounting board.

This method minimizes stress applied to the mounting board when repair or reworking is conducted, and also facilitates removal of the semiconductor device from the mounting board.

DETAILED DESCRIPTION OF THE INVENTION

Exemplary embodiments of the present invention are described below with reference to drawings. Each thickness and length is different from actual dimensions for reasons of convenience in preparing the drawings. The number of connecting terminals in a semiconductor device is different from the actual number, also for illustrative convenience.

First Exemplary Embodiment

Figure 1:
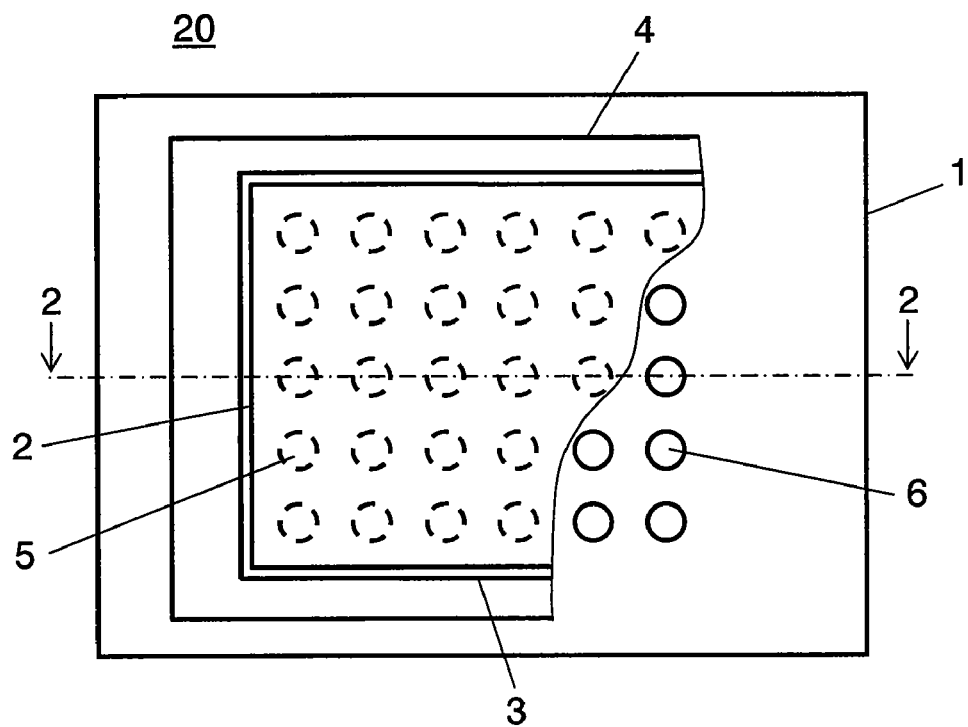
FIG. 1 is a schematic plan view of an electronic device in accordance with a first exemplary embodiment of the present invention.
Figure 2:
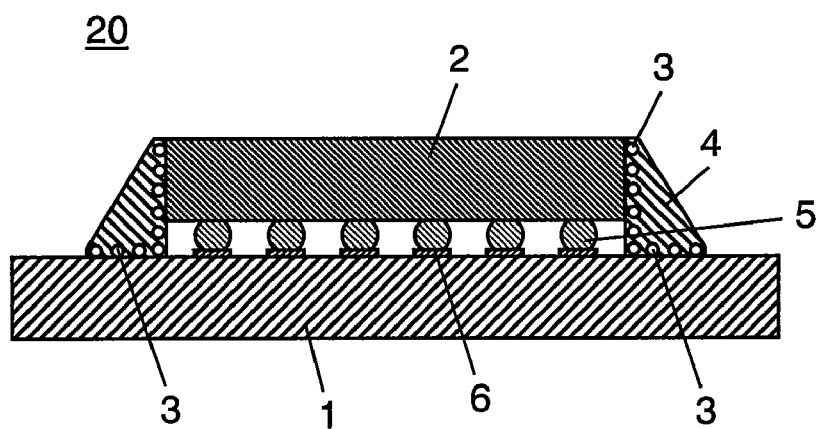
FIG. 2 is a sectional view taken along line 2-2 in FIG. 1.

FIGS. 1 and 2 illustrate a schematic structure of electronic device 20 in accordance with the first exemplary embodiment of the present invention. FIG. 1 is a plan view, and FIG. 2 is a sectional view taken along line 2-2 in FIG. 1. To facilitate understanding of the structure of mounting board 1, a part of semiconductor device 2, layer of thermally expandable particles 3, and adhesive 4 are removed in FIG. 1.

Electronic device 20 in this exemplary embodiment includes semiconductor device 2 having multiple bump electrodes 5 as connecting terminals; mounting board 1 facing semiconductor device 2, and being connected to the connecting terminals; thermally expandable particles 3 provided at least on one of a side of semiconductor device 2 and a surface of mounting board 1 around a projected area of semiconductor device 2; and adhesive 4 covering thermally expandable particles 3.

Semiconductor device 2 is a BGA-type semiconductor device that has multiple bump electrodes 5 aligned in the matrix on its one face that act as connecting terminals. The semiconductor device in this exemplary embodiment may use a resin board, ceramic board, or flexible board as an interposer. Alternatively, a semiconductor device called a CSP (chip scale package) may be used, or a flip-chip semiconductor element in which solder bumps are directly formed on the electrodes of a semiconductor element may be used. Bump electrodes 5 may be formed adopting a ball setting method for placing solder balls, or a printing method for supplying solder paste followed by reflow soldering. A plating method can also be used for forming bump electrodes 5. Bump electrodes 5 are made typically of one or more of the following: tin and zinc alloy, tin and bismuth alloy, tin and silver alloy, and zinc and bismuth alloy. Bump electrodes 5 may also be made of one or more of the following: gold, copper, nickel, gold-plated nickel, and gold-plated copper.

Mounting board 1 has a placement area for placing semiconductor device 2 on its one face, and lands 6 for electrical connection to bump electrodes 5 of semiconductor device 2 provided at the placement area.

The base material of mounting board 1 in this exemplary embodiment is made by hardening glass fibers or organic fibers, such as Kevlar®, by immersing epoxy resin, polyimide resin, polyamide resin, polyester resin, benzoxazol resin, or Teflon® resin. Other resin boards such as those made of BT resin are also applicable.

The conductor is made of copper foil, but a metal layer may also be formed on the copper foil. The metal layer is typically one or more of the following: solder, gold, silver, nickel, and palladium.

This exemplary embodiment refers to an example of mounting semiconductor device 2 on mounting board 1. However, multiple semiconductor devices or passive components such as capacitors can also be mounted.

Thermally expandable particles 3 are microcapsules configured with a shell made of fine thermoplastic copolymer resin, and organic solvent contained in this shell. The shell diameter is from 1 µm to 200 µm, and preferably from 5 µm to 50 µm. The microcapsule is typically made of copolymer resin of vinyl acetate acrylonitrile, methyl methacrylate acrylonitrile, vinylidene chloride-acrylonitrile, styrene acrylonitrile, acrylonitrile styrene butadiene, ethylene vinyl acetate, or ethylene vinyl alcohol. The organic solvent may typically include one or more of the following: N-methylpyrrolidone (NMP) and dimethylformamide (DMF). When electronic device 20 needs repair, thermally expandable particles 3 are heated to 80~200° C., depending on the vapor pressure of each organic solvent contained in thermally expandable particles 3. Heating softens the shell made of thermoplastic copolymer resin, and at the same time increases the vapor pressure of the organic solvent inside the shells. This causes the shell to expand and stretch, resulting in peeling of adhesive 4. Adhesive 4 is mainly made of thermosetting resin, and the expansion temperature of thermally expandable particles 3 is preferably higher than the thermal curing temperature of thermosetting resin in adhesive 4.

Adhesive 4 may typically include one or more of the following: epoxy resin, silicone resin, and cyanate ester. Epoxy resin may typically include one or more of the following: bisphenol A, bisphenol F, biphenyl, and naphthalene.

In addition to the above composition, adhesive 4 may also typically contain one or more of the following: filler, flame retardant, pigment, curing agent, and hardening accelerator in addition to the resin component. Photoinitiator may also be added. The photoinitiator triggers the photopolymerization reaction. When the photoinitiator absorbs UV light, it instantaneously generates a large amount of initiator (radicals), which act as a catalyst of the reaction between prepolymer and monomer. The photoinitiator transforms monomer (liquid) to polymer (solid) when it undergoes UV irradiation. For example, radical system photopolymer initiator(alklyphenone system copolymer initiator, acylphosphinoxide system copolymer initiator, titanocene, or titanocene system copolymer initiator), cation system copolymer initiator, or anion system copolymer initiator is used.

Alternatively, adhesive 4 may be a hot-melt type prepreg resin formed in a frame shape of a predetermined width around the placement area of semiconductor device 2.

Figure 3A:
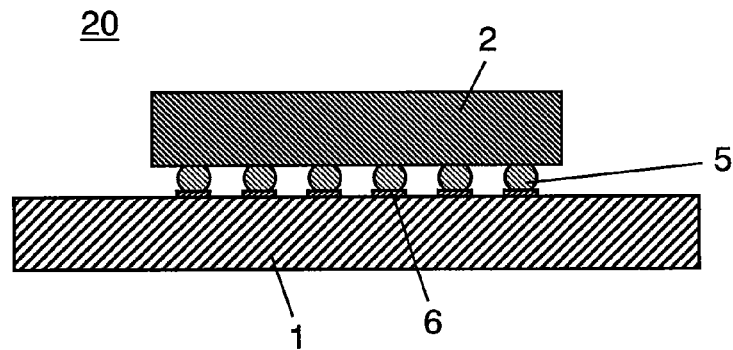
FIG. 3A is a sectional view of the electronic device illustrating a state that the semiconductor device is attached to the mounting board.

A method of manufacturing electronic device 20 in this exemplary embodiment is briefly described with reference to FIGS. 3A to 3C. FIG. 3A is a sectional view of electronic device 20 illustrating a state that semiconductor device 2 is bonded to mounting board 1. Solder paste is printed on lands 6 of mounting board 1 as shown in FIG. 3A, using a metal mask and squeegee. Then, semiconductor device 2 is disposed on lands 6 of mounting board 1, and bump electrodes 5 of semiconductor device 2 and lands 6 are connected by reflow soldering. In this way, semiconductor device 2 with multiple bump electrodes 5 as connecting terminals and mounting board 1 are electrically connected to complete the connecting step. Semiconductor device 2 is thus mounted on mounting board 1.

Figure 3B:
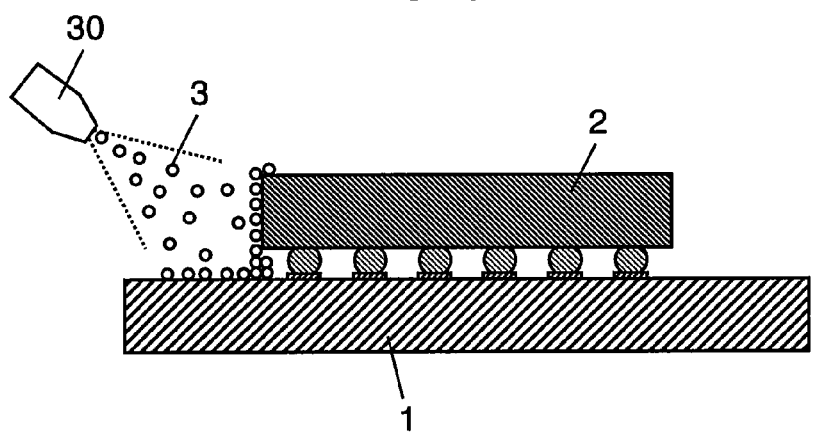
FIG. 3B is a sectional view illustrating an application step in which thermally expandable particles are injected.

FIG. 3B is a sectional view illustrating the step of applying thermally expandable particles 3. After the above connecting step, a layer of thermally expandable particles 3 is formed by injecting and applying thermally expandable particles 3 in the form of microcapsules from injector 30 on at least one of a side of semiconductor device 2 and the surface of mounting board 1 around the projected area of semiconductor device 2, as shown in FIG. 3B. FIG. 3B shows an example of forming the layer of thermally expandable particles 3 on both the sides of semiconductor device 2 and the surface of mounting board 1 around the projected area of semiconductor device 2. When thermally expandable particles 3 are injected from the nozzle of injector 30 at high speed, thermally expandable particles 3 are charged by mutual friction. This enables the application of thermally expandable particles 3 by the static electricity generated between the sides of semiconductor device 2 and the surface of mounting board 3 and thermally expandable particles 3. Another charging method of thermally expandable particles 3 is to install a charging device in injector 30 so as to inject and apply pre-charged thermally expandable particles 3. The thermally expandable particles 3 applied in this way are charged at the same polarity, and thus a mutually repulsive force exists among the particles 3. This enables application of thermally expandable particles 3 in a state retaining a certain distance between adjacent thermally expandable particles 3.

Figure 3C:
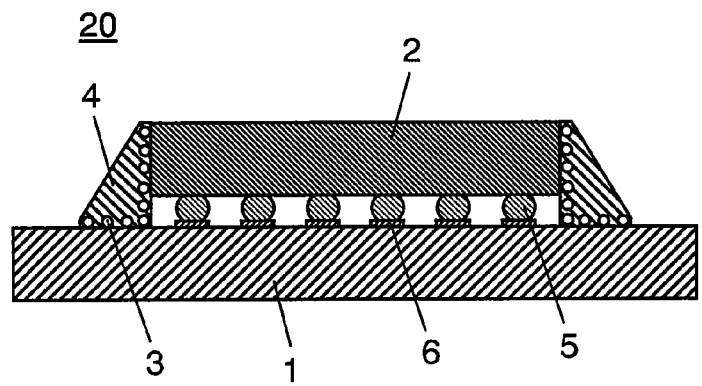
FIG. 3C is a sectional view illustrating a state after adhesive is applied.

FIG. 3C is a sectional view illustrating the state after applying adhesive. Next, adhesive 4 is applied, typically using a dispenser, to cover the layer of thermally expandable particles 3 formed on at least one of a side of semiconductor device 2 and the surface of mounting board 1 around the projected area of semiconductor device 2. This completes the application step of applying adhesive 4.

Lastly, semiconductor device 2 is bonded and fixed to mounting board 1 by thermally curing adhesive 4 at the curing temperature of adhesive 4 for a predetermined time. Adhesive 4 reaches the sides of semiconductor device 2 and the surface of mounting board 1 around the projected area of semiconductor device 2 through spaces created by the mutual repulsive force of thermally expandable particles 3 in the layer of thermally expandable particles 3; and spreads over their respective faces. Accordingly, semiconductor device 2 is bonded and fixed to mounting board 1 by thermally curing this spread adhesive 4. This completes the fixing step of bonding and fixing semiconductor device 2 on the top face of mounting board 1.

Figure 4A:
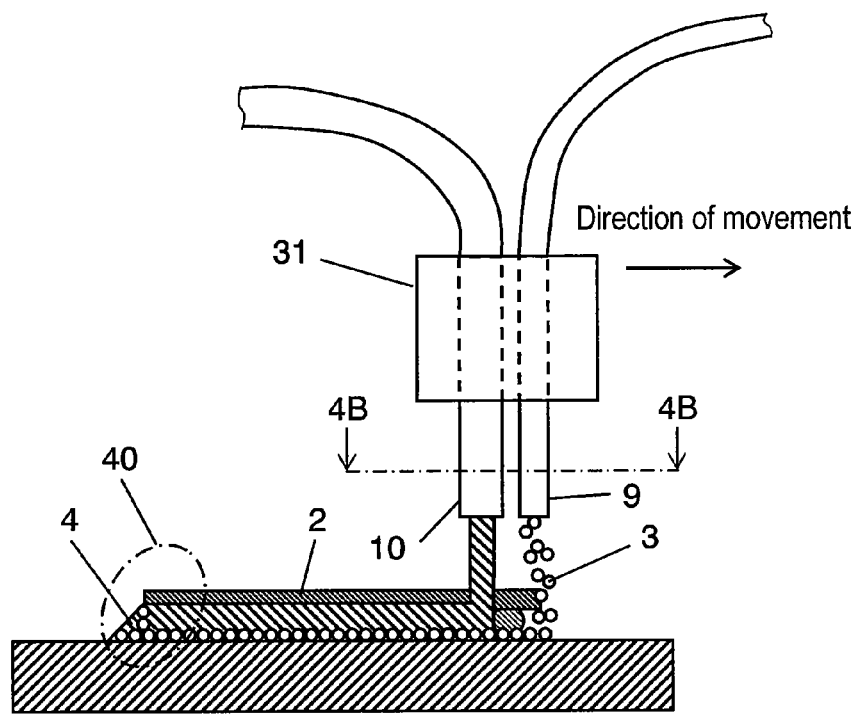
FIG. 4A is a schematic sectional view of a structure of an injector in accordance with the first exemplary embodiment of the present invention.
Figure 4B:
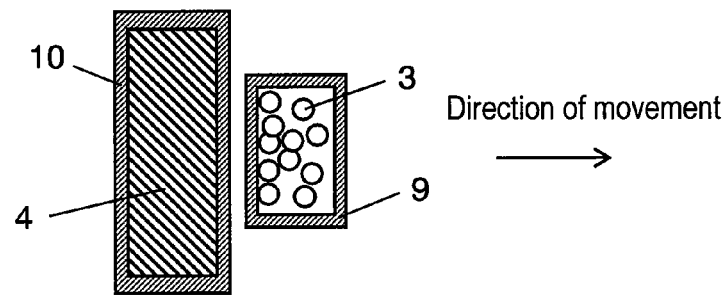
FIG. 4B is a sectional view taken along line 4B-4B in FIG. 4A.
Figure 5:
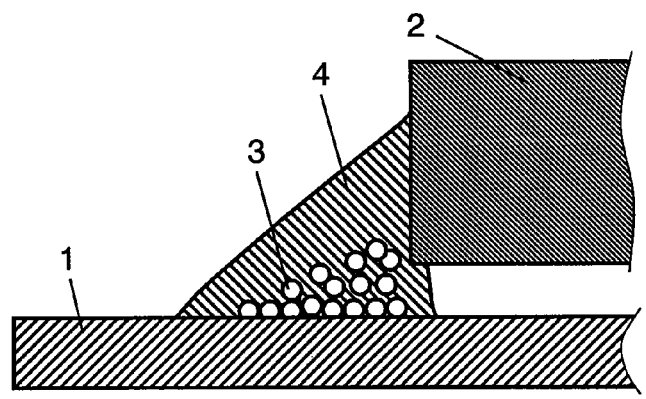
FIG. 5 is a magnified sectional view of a portion marked with dotted line 40 in FIG. 4.

To omit the step shown in FIG. 3B, injector 31 shown in FIG. 4A may be used. FIG. 4A is a schematic sectional view of the structure of injector 31 in the first exemplary embodiment. Injector 31 includes first nozzle 9 for injecting a predetermined amount of thermally expandable particles 3 in the form of microcapsules, and second nozzle 10 for injecting a predetermined amount of adhesive 4. The nozzles are separated by a predetermined distance. First nozzle 9 is disposed at a position in the direction of movement of injector 31 relative to second nozzle 10. The injection pressure or time of first nozzle 9 and second nozzle 10 is independently controllable. FIG. 4B is a sectional view taken along line 4B-4B in FIG. 4A. FIG. 5 is a magnified sectional view of a portion circled by dotted line 40. As shown in FIG. 4B, first nozzle 9 and second nozzle 10 are tubes with a rectangular cross-section (hereinafter referred to as a "rectangular tube"). The outlet cross-sectional area of first nozzle 9 injecting thermally expandable particles 3 is smaller than the outlet cross-sectional area of second nozzle 10 injecting adhesive 4. The rectangular tube width of second nozzle 10, seen from the direction of movement, is wider than that of first nozzle 9. This enables application of thermally expandable particles 3 to the top face of mounting board 1, and then formation of adhesive 4 covering thermally expandable particles 3, as shown in FIG. 5. More specifically, after injecting thermally expandable particles 3 onto at least one of a side of semiconductor device 2 and the surface of mounting board 1 around the projected area of semiconductor device 2 using first nozzle 9, adhesive is applied to cover thermally expandable particles 3 using second nozzle 10. The rectangular tubes are used for first nozzle 9 and second nozzle 10 of injector 31 in this exemplary embodiment. However, the tubes may also be round tubes. In this case, the inner diameter of first nozzle 9 is set smaller than the inner diameter of second nozzle 10 to gain the same effect as that of the rectangular tube described above.

Figure 6A:
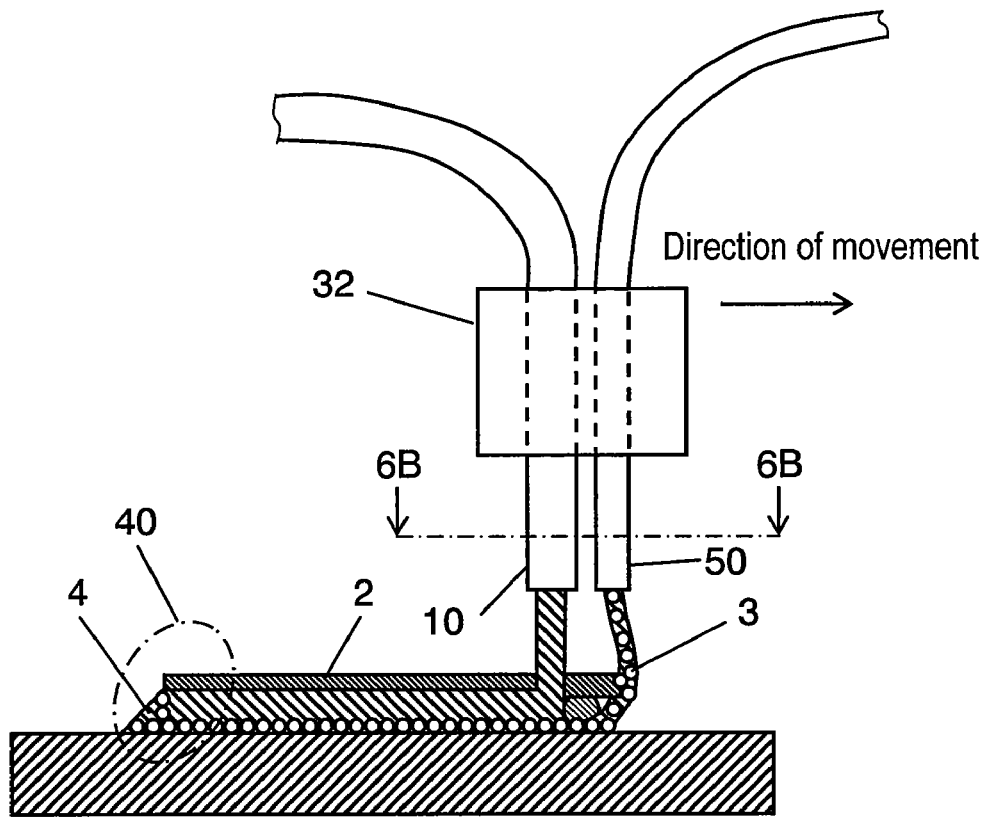
FIG. 6A is a schematic sectional view of another structure of the injector in accordance with the first exemplary embodiment of the present invention.
Figure 6B:
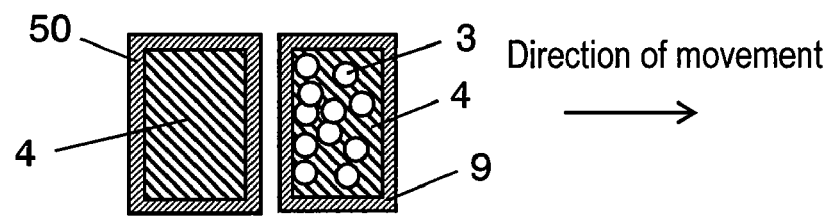
FIG. 6B is a sectional view taken along line 6B-6B in FIG. 6A.

Alternatively, injector 32 shown in FIG. 6A may be used to omit the step shown in FIG. 3B. FIG. 6A is a schematic sectional view of another structure of injector 32 in the first exemplary embodiment of the present invention. Injector 32 includes first nozzle 50 for injecting a mixture of a predetermined amount of thermally expandable particles 3 in the form of micro capsules and adhesive 4 as disperse media, and second nozzle 10 for injecting a predetermined amount of adhesive 4. Both nozzles are disposed with a predetermined distance in between. First nozzle 50 is disposed in the direction of movement of injector 32 relative to second nozzle 10. The injection pressure or time of first nozzle 50 and second nozzle 10 is independently controllable. FIG. 6B is a sectional view taken along line 6B-6B in FIG. 6A. As shown in FIG. 6B, first nozzle 50 and second nozzle 10 are tubes with a rectangular cross-section (hereinafter referred to as "rectangular tubes"). The outlet cross-sectional area of first nozzle 50 injecting thermally expandable particles 3 dispersed in adhesive 4 as disperse media is smaller than that of second nozzle 10 injecting adhesive 4. The width of rectangular tube of second nozzle 10, when seen from the direction of movement, is at least of one the same and wider than that of first nozzle 50. Adhesive 4 as disperse media may be mainly made of thermosetting resin.

More specifically, unlike that in FIG. 4B, first nozzle 50 injects in advance a predetermined amount of thermally expandable particles 3 in the form of microcapsules mixed with adhesive 4 as disperse media. Injection of the mixture improves bonding between the mixture and adhesive 4 injected from second nozzle 10. Accordingly, thermally expandable particles 3 are disposed on the top face of mounting board 1, as shown in FIG. 5, and adhesive 4 covers thermally expandable particles 3, even if the rectangular tube widths of first nozzle 50 and second nozzle 10 are equivalent when seen from the direction of movement. Rectangular tubes are used for first nozzle 50 and second nozzle 10 of injector 32 in this exemplary embodiment. However, these nozzles may be round tubes. In this case, the inner diameter of first nozzle 50 is set to be the same or smaller than the inner diameter of second nozzle 10 to achieve the same effect as that of the rectangular tubes described above.

In electronic device 20 in this exemplary embodiment as manufactured above, thermosetting adhesive 4 suppresses strain on mounting board 1 around semiconductor device 2 caused by impact applied to mounting board 1 such as by dropping, at normal usage temperatures of the equipment. Accordingly, stress applied to the connected portion of semiconductor device 2 and mounting board 1 can be reduced, thus increasing the impact resistance.

Next, a method of repairing electronic device 20 in this exemplary embodiment is described. If any failure in semiconductor device 2 is detected in an electrical inspection after manufacture of electronic device 20, electronic device 20 is heated to 80~200° C., depending on the vapor pressure of each organic solvent contained in thermally expandable particles 3. Heating softens the shells made of thermoplastic copolymer resin of thermally expandable particles 3, and at the same time increases the vapor pressure of the organic solvent inside the shells. This causes the shells to expand and stretch. As a result, force is generated to peel off adhesive 4 on the boundary face of mounting board 1 and adhesive 4, and the boundary face of the sides of semiconductor device 2 and adhesive 4. Electronic device 20 is then further heated to melt the solder in the connected portions of bump electrodes 5 of semiconductor device 2 and lands 6 of mounting board 1. The heating temperature this time is the same or higher than a melting point of solder in the connected portions. After the solder has melted, semiconductor device 2 is removed from mounting board 1. This completes the removable step. The use of this method minimizes any residue of adhesive 4 on the surface of mounting board 1 after removing semiconductor device 2 from mounting board 1.

The above manufacturing method offers a highly reliable electronic device 20 that allows quick repair. In addition, the step of shaving off adhesive 4, typically using of a knife, can be eliminated. Accordingly, a significant reduction in man-hours and of wastage of boards are achievable.

Second Exemplary Embodiment

Figure 7:
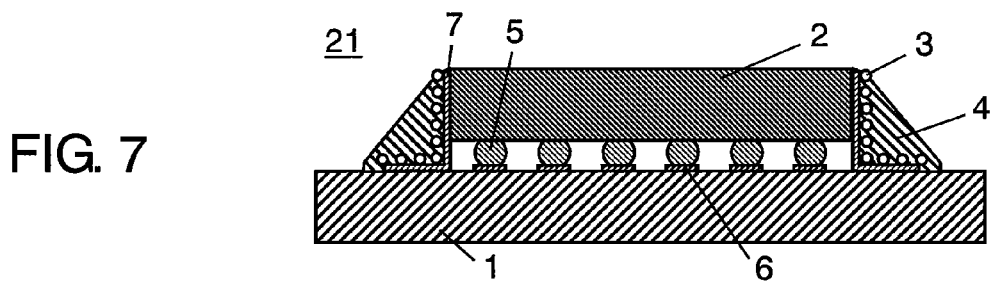
FIG. 7 is a sectional view of an electronic device in accordance with a second exemplary embodiment of the present invention.

FIG. 7 is a sectional view of electronic device 21 in the second exemplary embodiment of the present invention. A point that differs from the first exemplary embodiment is that disperse media 7 is provided on a boundary face of thermally expandable particles 3 and semiconductor device 2, and a boundary face of thermally expandable particles 3 and mounting board 1. The other structures are the same.

More specifically, as shown in FIG. 7, electronic device 21 in this exemplary embodiment includes semiconductor device 2, mounting board 1 on which semiconductor device 2 is placed, a film of disperse media 7 applied on the sides of semiconductor device 2 and a surface of mounting board 1 around semiconductor device 2, thermally expandable particles 3 dispersed and applied on the film surface of disperse media 7, and adhesive 4 provided such that to covering the film of disperse media 7 and thermally expandable particles 3.

Disperse media 7 may be made of insulating liquid adhesive 4, same as that described in the first exemplary embodiment, or a different material. This structure enables reliable retention of thermally expandable particles 3 even if impact such as vibration is applied to mounting board 1 during the manufacture of electronic device 21.

Next, a method of manufacturing electronic device 21 in this exemplary embodiment is described with reference to FIGS. 8A to 8D.

Figure 8A:
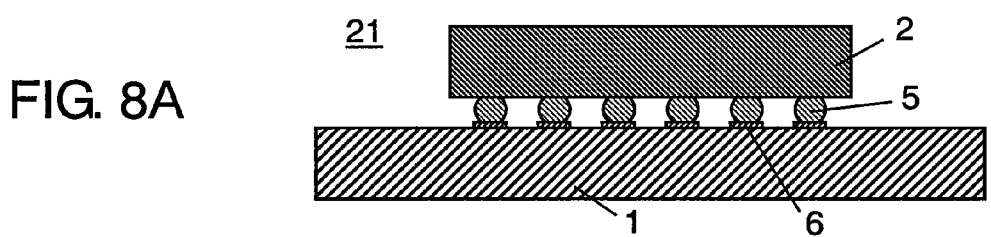
FIG. 8A is a sectional view of the electronic device illustrating a state that the semiconductor device is attached to the mounting board.

FIG. 8A is a sectional view of the electronic device illustrating a state that the semiconductor device is bonded to the mounting board. First, solder paste is printed on lands 6 of mounting board 1, as shown in FIG. 8A, by using a metal mask and squeegee. Then, semiconductor device 2 is placed on lands 6 of mounting board 1, and bump electrodes 5 of semiconductor device 2 and lands 6 are connected by reflow soldering. Semiconductor device 2 is thus mounted on mounting board 1. This completes the connecting step.

Figure 8B:
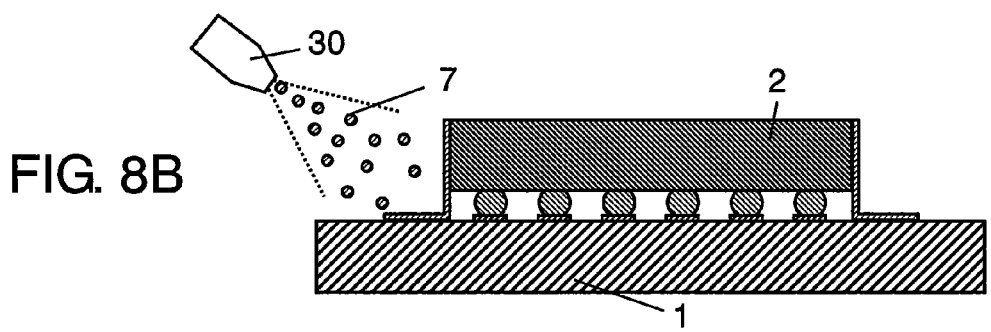
FIG. 8B is a sectional view of an application step in which disperse media is injected.

FIG. 8B is a sectional view illustrating the application step of injecting the disperse media. After the above connecting step, injector 30 injects liquid disperse media 7 onto the sides of semiconductor device 2 and the surface of mounting board 1 around a projected area of semiconductor device 2 so as to form a film of liquid disperse media 7 with a predetermined thickness. Accordingly, disperse media 7 is applied to the boundary face of thermally expandable particles 3 and semiconductor device 2, and the boundary face of thermally expandable particles 3 and mounting board 1 in the application step.

Figure 8C:
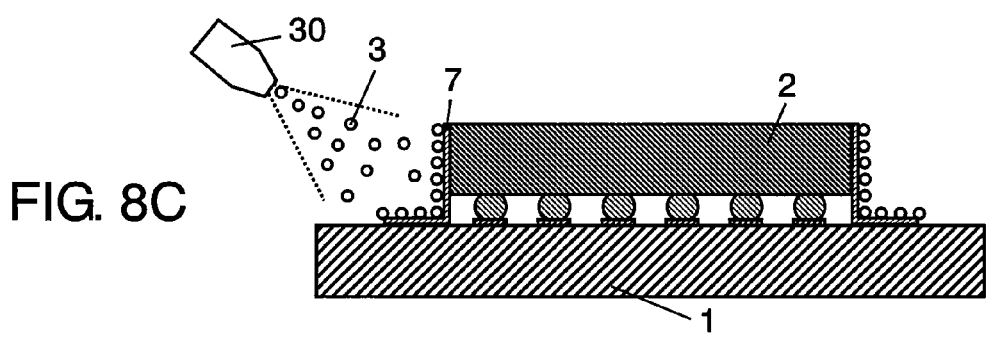
FIG. 8C is a sectional view illustrating the application step in which thermally expandable particles are injected.

FIG. 8C is a sectional view of the application step of injecting the thermally expandable particles. After the application step of disperse media 7 described above, injector 30 injects and applies thermally expandable particles 3 in the form of microcapsules of very fine particles on the film of disperse media. This completes the application step. In injector 30, a nozzle for disperse media 7 and a nozzle for thermally expandable particles 3 are separated by a predetermined distance. Thermally expandable particles 3 may be applied over disperse media 7 simultaneously at the formation of a film of disperse media 7. This also enables completion of the application step.

Figure 8D:
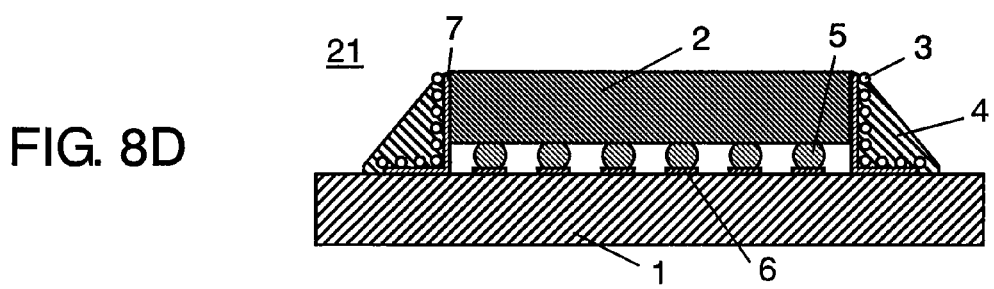
FIG. 8D is a sectional view illustrating a state after adhesive is applied.

FIG. 8D is a sectional view illustrating a state after applying the adhesive. After the application step described above, adhesive 4 is applied, typically using a dispenser, for covering the film of disperse media 7 formed on the top face of mounting board 1 around semiconductor device 2 and thermally expandable particles 3 on the film surface, as shown in FIG. 8D, so as to bond and fix semiconductor device 2 onto mounting board 1. Thermally expandable particles 3 retain a certain distance between each other by the repulsive force caused by the static electricity. Injector 30 includes a nozzle for injecting a predetermined amount of thermally expandable particles 3 in the form of microcapsules, and a nozzle for injecting a predetermined amount of adhesive 4. These nozzles are separated by a predetermined distance in injector 30. Thermally expandable particles 3 and adhesive 4 may be applied simultaneously over the layer of disperse media 7 by moving the nozzles in a direction that thermally expandable particles 3 are applied as a lower layer. Then, by heating and curing adhesive 4, semiconductor device 2 is bonded and fixed to the top face of mounting board 1. This completes the fixing step of bonding and fixing semiconductor device 2 onto the top face of mounting board 1.

In electronic device 21 in this exemplary embodiment as manufactured using the above steps, thermosetting adhesive 4 suppresses strain on mounting board 1 around semiconductor device 2 caused by impact applied to mounting board 1 such as by dropping, at normal usage temperatures of the equipment. Accordingly, peeling which may occur at a soldered portion of mounting board 1 can be suppressed, thus increasing the impact resistance.

Electronic device 21 in this exemplary embodiment adopts a repair method same as that in the first exemplary embodiment. More specifically, entire electronic device 21 is heated to an expansion temperature of a foaming agent so as to soften the shells, and at the same time to increase the vapor pressure of the organic solvent inside the shells. As a result, microcapsules dispersed inside adhesive 4 provided near the sides of semiconductor device 2 and the surface of the mounting board around semiconductor device 2 are heated and expanded. This causes a peeling force near the boundary face between the surface of mounting board 1 and adhesive 4 and the boundary face between the sides of semiconductor device 2 and adhesive 4. Accordingly, adhesive 4 can be peeled from mounting board 1 without leaving adhesive 4 on the surface of mounting board 1. This exemplary embodiment refers to an example of providing thermally expandable particles 3 on the film of disperse media 7 on the sides of semiconductor device 2 and the surface of mounting board 1 around the projected area of semiconductor device 2. However, adhesive 4 can be peeled from mounting board 1 without leaving adhesive 4 on the surface of mounting board 1 simply by applying thermally expandable particles 3 to mounting board 1.

The conventional step of shaving off adhesive 4, typically using of a knife, can thus be eliminated. Accordingly, a significant reduction in man-hours and of wastage of boards are achievable.

Third Exemplary Embodiment

Figure 9:
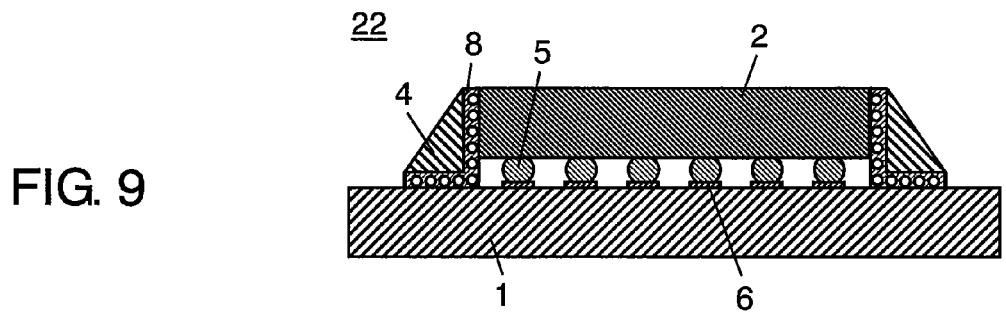
FIG. 9 is a sectional view of an electronic device in accordance with a third exemplary embodiment of the present invention.

FIG. 9 is a sectional view of electronic device 22 in the third exemplary embodiment of the present invention. A point that differs from the first exemplary embodiment in this third exemplary embodiment is that thermally expandable particles 3 are resin 8 in which thermally expandable particles 3 are mixed in advance with disperse media 7 (hereinafter referred to as "mixed resin 8"). The other structures are the same.

More specifically, as shown in FIG. 9, electronic device 22 in this exemplary embodiment includes semiconductor device 2, mounting board 1 on which semiconductor device 2 is placed, a film of mixed resin 8 applied to the sides of semiconductor device 2 and the surface of the mounting board 1 around a projected area of semiconductor device 2, and adhesive 4 covering the film of mixed resin 8.

In electronic device 22 in this exemplary embodiment as configured above, adhesive 4, mainly containing thermosetting resin, firmly bonds and fixes the sides of semiconductor device 2 and the surface of mounting board 1 around the projected area of semiconductor device 2 at temperatures at which the equipment is normally used. Accordingly, strain on mounting board 1 around semiconductor device 2 is suppressed, even if impact is applied to mounting board 1 such as by dropping. This enables suppression of peeling at a soldered portion of mounting board 1, thus increasing impact resistance.

If any failure is detected in electronic device 22 in this exemplary embodiment such that semiconductor device 2 needs to be removed from mounting board 1 for replacement, the entire electronic device 22 is heated to 80~200° C., depending on the expansion temperature of the foaming agent, so as to both soften the shells and increase the vapor pressure of the organic solvent inside the shells. This thermally expands the microcapsules dispersed in mixed resin 8 provided on the sides of semiconductor device 2 and the surface of mounting board 1 around the projected area of semiconductor device 2. A peeling force is thereby generated near the boundary face between the surface of mounting board 1 and adhesive 4 and the boundary face between the sides of semiconductor device 2 and adhesive 4. As a result, adhesive 4 can be peeled from mounting board 1 without leaving adhesive 4 on the surface of mounting board 1. This exemplary embodiment refers to an example of providing thermally expandable particles 3 in the film of mixed resin 8 on the sides of semiconductor device 2 and the surface of mounting board 1 around the projected area of semiconductor device 2. However, adhesive 4 can be peeled from mounting board 1 without leaving adhesive 4 on the surface of mounting board 1 simply by applying thermally expandable particles 3 to mounting board 1.

The conventional step of shaving off adhesive 4, typically using a knife, can thus be eliminated. Accordingly, a significant reduction in man-hours and of wastage of boards are achievable.

Figure 10A:
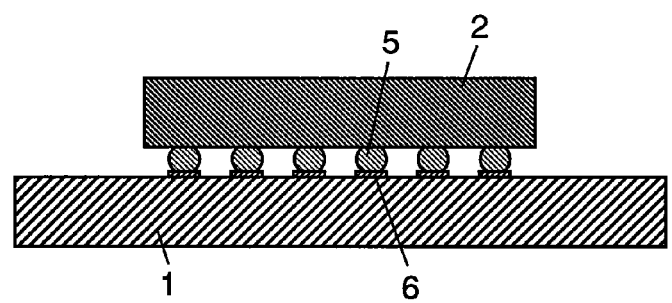
FIG. 10A is a sectional view of the electronic device in a state that the semiconductor device is bonded to the mounting board.

Next, a method of manufacturing electronic device 22 in this exemplary embodiment is described with reference to FIGS. 10A to 10C. FIG. 10A is a sectional view of electronic device 22 illustrating a state that semiconductor device 2 is bonded to mounting board 1. Semiconductor device 2 shown in FIG. 10A is bonded to mounting board 1 using the same method as that in the first exemplary embodiment.

Figure 10B:
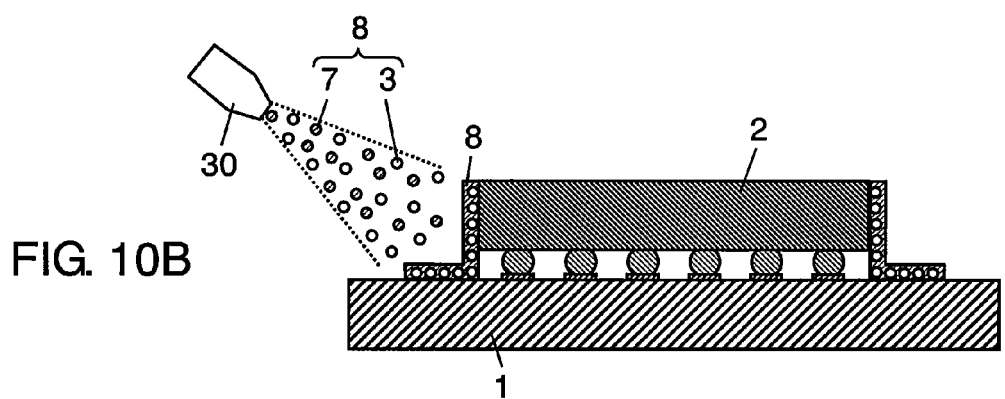
FIG. 10B is a sectional view illustrating the application step of injecting mixed resin.

FIG. 10B is a sectional view illustrating the application step of injecting the mixed resin 8. Mixed resin 8 is a mixture of thermally expandable particles 3 and disperse media 7, and this mixed resin 8 is injected in the liquid form from injector 30 to the sides of semiconductor 2 and the surface of mounting board 1 around the projected area of semiconductor device 2, as shown in FIG. 10B. Through this step, a layer of liquid mixed resin 8 is formed in a predetermined thickness. As described above, thermally expandable particles 3 may be dispersed in disperse media 7 in the application step. In other words, it is applicable as long as disperse media 7 contains an adhesive resin component.

Figure 10C:
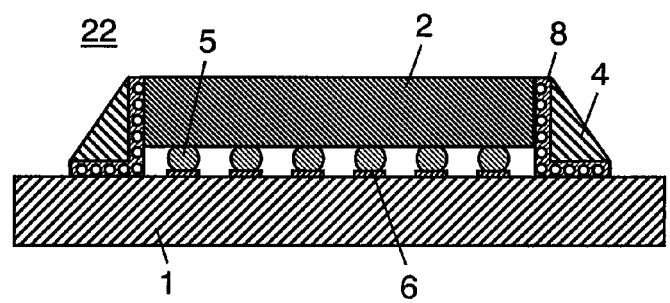
FIG. 10C is a sectional view illustrating a state after applying adhesive.

FIG. 10C is a sectional view illustrating a state after applying adhesive 4. Lastly, adhesive 4 is applied, typically using a dispenser, over the layer of mixed resin 8 formed on the sides of semiconductor device 2 and the surface of mounting board 1 around the projected area of semiconductor device 2. Then, semiconductor device 2 is bonded and fixed to mounting boar 1 by thermally curing adhesive 4. Alternatively, mixed resin 8 and adhesive 4 may be simultaneously applied by using injector 30 equipped with a nozzle for injecting mixed resin 8 and a nozzle for injecting adhesive 4 such that the nozzle for injecting mixed resin 8 is disposed at the side of mounting board 1 relative to the nozzle for adhesive 4.

In electronic device 22 in this exemplary embodiment as manufactured using the above steps, adhesive 4 made of thermosetting resin suppresses strain on mounting board 1 around semiconductor device 2 caused by impact applied to mounting board 1 such as by dropping, at normal usage temperatures of the equipment. Accordingly, peeling that may occur at a soldered portion of mounting board 1 can be reduced, thus increasing the impact resistance.

If electronic device 22 manufactured using the manufacturing steps in this exemplary embodiment requires repair due to a failure of semiconductor device 2 detected in an electrical inspection, electronic device 22 is heated to 80~200° C. to expand thermally expandable particles 3 for facilitating and cleanly removing adhesive 4 on the boundary face between mixed resin 8 and semiconductor device 2 and the boundary face between mixed resin 8 and mounting board 1. Highly reliable electronic device 22 that allow quick repair is thus achieved. In addition, the step of shaving off adhesive 4, typically using a knife, can be eliminated. Accordingly, a significant reduction in man-hours and of wastage of boards are achievable.

In the first to third exemplary embodiments, thermally expandable particles 3 or mixed resin 8 may be provided at discontinuous points on the surface of mounting board 1 around the projected area of semiconductor device 2.

This structure secures a broader adhesion area between mounting board 1 and adhesive 4, thus increasing the adhesion strength between mounting board 1 and adhesive 4 during normal use. In addition, by providing thermally expandable particles 3 or mixed resin 8 at discontinuous points, peeling points between mounting board 1 and adhesive 4 are dispersed at predetermined intervals. This structure enables the efficient expansion of a small number of thermally expandable particles 3 at each peeling point so as to gently peel off adhesive 4 from mounting board 1 during the repair process.

Fourth Exemplary Embodiment

Figure 11:
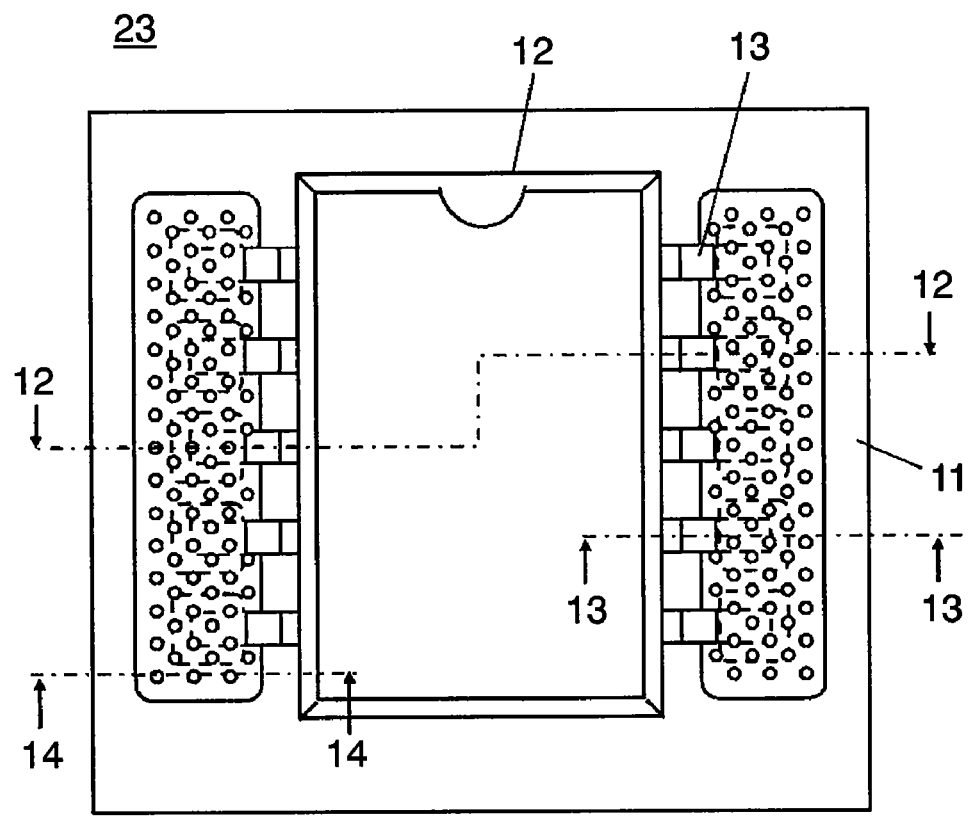
FIG. 11 is a plan view of an electronic device in accordance with a fourth exemplary embodiment of the present invention.
Figure 12:
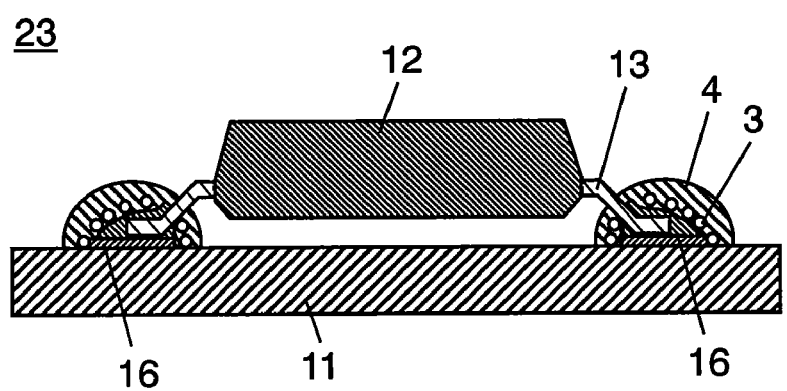
FIG. 12 is a sectional view of the electronic device taken along line 12-12 in FIG. 11.
Figure 13:
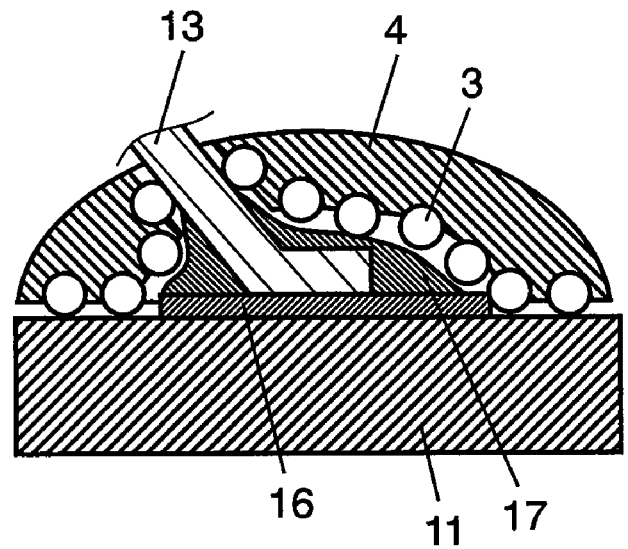
FIG. 13 is a magnified sectional view taken along line 13-13 in FIG. 11.
Figure 14:
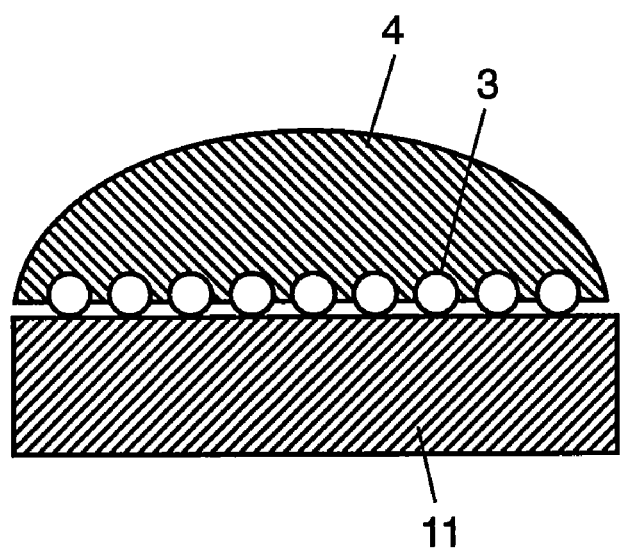
FIG. 14 is a magnified sectional view taken along line 14-14 in FIG. 11.

FIGS. 11 to 14 illustrate a structure of electronic device 23 in the fourth exemplary embodiment of the present invention. FIG. 11 is a plan view, FIG. 12 is a sectional view taken along line 12-12 in FIG. 11, FIG. 13 is a magnified sectional view taken along line 13-13 in FIG. 11, and FIG. 14 is a magnified sectional view taken along line 14-14 in FIG. 11.

Electronic device 23 in this exemplary embodiment includes semiconductor device 12, mounting board 11 on which semiconductor device 12 is placed, thermally expandable particles 3 provided on a connected portion of outer lead 13 of semiconductor device 12 and a land of mounting board 11, and adhesive 4 covering thermally expandable particles 3.

Semiconductor device 12 is a TSOP (thin small outline package) type semiconductor device, and includes multiple outer leads 13 extending from the sides of a package, in which a semiconductor element of semiconductor device 12 is installed, as connecting terminals. Mounting board 11 has connecting electrodes for connecting to outer leads 13 on the surface of mounting board 1 around the projected area of semiconductor device 2. Thermally expandable particles 3 are provided over connected portions of outer leads and connecting electrodes.

The above description refers to TSOP for the package shape. However, it is apparent that SOP, TQFP, or QFP is also applicable. A package may be made of resin or alumina ceramic.

As shown in FIG. 13, each of outer leads 13 is electrically connected to land 16 by solder 17, and thermally expandable particles 3 are provided on the surface of solder 17. Thermally expandable particles 3 are also provided on the surface of mounting board 11, as shown in FIGS. 13 and 14. Adhesive 4 is provided around land 16 on solder and the surface of mounting board 11 such that it covers thermally expandable particles 3.

In electronic device 23 in this exemplary embodiment as configured above, thermosetting adhesive 4 firmly bonds and fixes the sides of semiconductor device 12 and the surface of mounting board 11 around the projected area of semiconductor device 12. Accordingly, strain on mounting board 11 around semiconductor device 2 is suppressed, even if impact is applied to mounting board 1 such as by dropping. This enables suppression of cracking or peeling at a portion of mounting board 11 connected by solder 17, thus increasing the impact resistance.

Next, a method of manufacturing this electronic device 23 is briefly described. Solder paste is printed on lands 16 of mounting board 11, as shown in FIG. 12, by typically using a metal mask and squeegee. Then, semiconductor device 12 is placed on lands 16 of mounting board 11, and outer leads 13 of semiconductor device 12 and land 16 are connected by reflow soldering. Accordingly, semiconductor device 12 is mounted on mounting board 11. This completes the connecting step.

Then, an injector (not illustrated) injects and applies thermally expandable particles 3 in the form of microcapsules on the surface of solder 17 connecting outer leads 13 of semiconductor device 12 and lands 16, and on the surface of mounting board 11 around lands 16, as shown in FIG. 12, in the same way as the first exemplary embodiment. When thermally expandable particles 3 are injected from the nozzle of the injector at high speed, thermally expandable particles 3 are charged by mutual friction. This enables the application of thermally expandable particles 3 by the static electricity generated between solder 17 of semiconductor device 12 and the surface of mounting board 11 and thermally expandable particles 3. Another charging method of thermally expandable particles 3 is to install a charging device in the injector so as to inject and apply pre-charged thermally expandable particles 3. The thermally expandable particles 3 applied in this way are charged at the same polarity, and thus a mutually repulsive force exists among the particles 3. This enables application of thermally expandable particles 3 in the state retaining a certain distance between adjacent thermally expandable particles 3.

Next, adhesive 4 is applied, typically using a dispenser, such that it covers thermally expandable particles 3 on mounting board 11, as shown in FIGS. 11 and 12. This completes the application step.

Then, semiconductor device 12 is bonded and fixed to mounting board 11 by thermally curing adhesive 4. This completes the fixing step. Same as the first exemplary embodiment, thermally expandable particles 3 may be injected from the injector together with adhesive 4. Still more, same as the second exemplary embodiment, thermally expandable particles 3 may be provided after applying disperse media. Furthermore, same as the third exemplary embodiment, mixed resin, in which thermally expandable particles 3 are mixed with adhesive 4 in advance, may be used.

When a failure in semiconductor device 12 is detected in an electrical inspection and repair is needed for electronic device 23 manufactured through the above steps in this exemplary embodiment, electronic device 23 is heated to 80° C.~200° C. so as to cause foaming of thermally expandable particles 3. This enables easy and clean removable of adhesive 4 on the boundary face among adhesive 4, semiconductor device 12, and mounting board 11. Accordingly, mounting board 11 can be reused.

This manufacturing method offers highly reliable electronic device 23 that allows quick repair, and also enables elimination of the step of shaving off adhesive 4, typically using a knife. Accordingly, a significant reduction in man-hours and of wastage of boards are achievable.

Fifth Exemplary Embodiment

Figure 15:
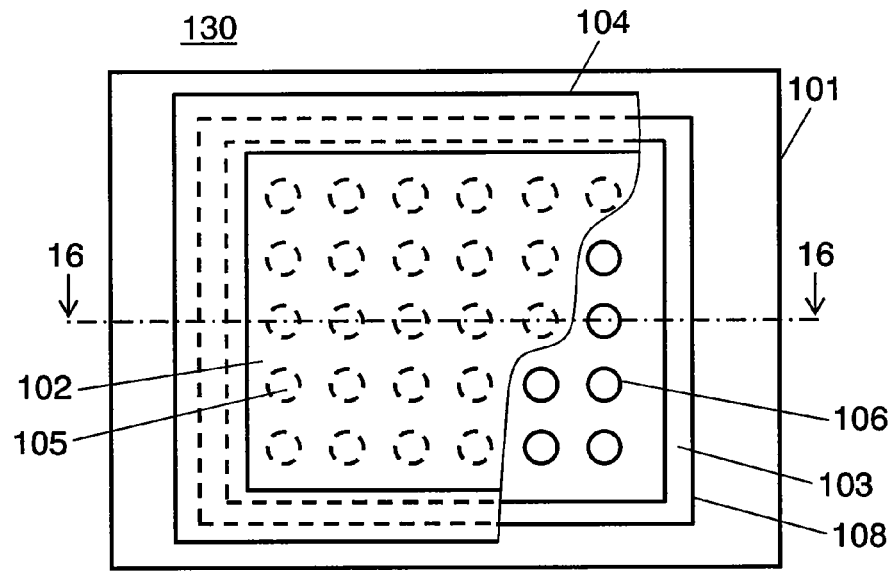
FIG. 15 is a partly cutaway plan view illustrating a structure of an electronic device in accordance with a fifth exemplary embodiment of the present invention.
Figure 16:
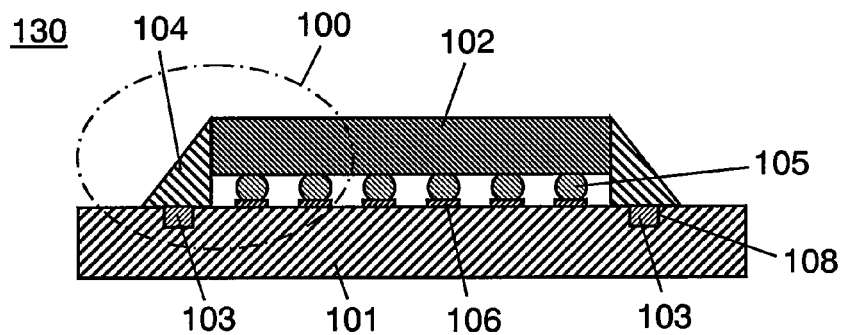
FIG. 16 is a sectional view taken along line 16-16 in FIG. 15 in accordance with the fifth exemplary embodiment of the present invention.
Figure 17:
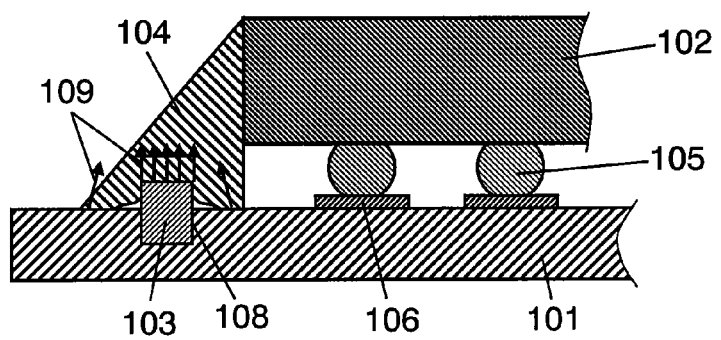
FIG. 17 is a magnified sectional view of a portion circled with dotted line 100 in FIG. 16.

FIGS. 15 to 17 illustrate a structure of electronic device 130 in the fifth exemplary embodiment of the present invention.

FIG. 15 is a partly cutaway plan view, FIG. 16 is a sectional view taken along line 16-16 in FIG. 15, and FIG. 17 is a magnified sectional view of a portion circled with dotted line 100 in FIG. 16. To facilitate understanding of the structure of mounting board 101, a part of semiconductor device 102 and adhesive 104 are removed in FIG. 15.

Electronic device 130 in this exemplary embodiment includes semiconductor device 102, mounting board 101 on which semiconductor device 102 is placed, thermally expandable particles embedded in dent 108 created in the surface of mounting board 101 around the projected area of semiconductor device 102, and adhesive 104 provided on the sides of semiconductor device 102 and the surface of mounting board 101 around the projected area of semiconductor device 102 such that it covers an area where thermally expandable particles 103 are provided.

Semiconductor device 102 is a BGA-type semiconductor device, and has multiple bump electrodes 105 aligned in the matrix on its one face. Semiconductor device 102 in this exemplary embodiment may use, for example, a resin board, ceramic board, or flexible board as an interposer. Still more, a semiconductor device called CSP (chip scale package) is also applicable. Furthermore, a flip-chip semiconductor element in which solder bumps are directly formed on electrodes of the semiconductor element is also applicable. Bump electrodes 105 are formed using a ball setting method that places solder balls. Alternatively, bump electrodes 105 may be formed by printing followed by reflow soldering, or by plating. Bump electrodes 5 may be made of one or more of the following: tin and zinc alloy, tin and bismuth alloy, tin and silver alloy, and zinc and bismuth alloy. Bump electrodes 5 may also be made of one or more of the following: gold, copper, nickel, gold-plated nickel, and gold-plated copper.

Mounting board 101 includes conductive lands 106 on its one face. These lands 106 are disposed at positions corresponding to bump electrodes 105 of semiconductor device 102 when mounting board 101 and semiconductor device 102 face each other. Mounting board 101 also includes dent 108 with a predetermined width and depth in the surface of mounting board 101 around the projected area of semiconductor device 102 (a strip of mounting board 1 around an area of mounting board 101 occupied by semiconductor device 102) when semiconductor device 102 is mounted on mounting board 1.

The base material of mounting board 1 in this exemplary embodiment is made by hardening glass fibers or organic fibers, such as Kevlar®, by immersing epoxy resin, polyimide resin, polyamide resin, polyester resin, benzoxazol resin, or Teflon® resin. Other resin boards such as those made of BT resin are also applicable.

The conductor is made of copper foil, but a metal layer may also be formed on the copper foil. The metal layer is typically one or more of the following: solder, gold, silver, nickel, and palladium.

Dent 108 in mounting board 101 is created by cutting, typically using a router, at a position around the projected area of semiconductor device 102 when semiconductor device 102 is placed.

This exemplary embodiment refers to an example of mounting semiconductor device 102 on mounting board 101. However, multiple semiconductor devices or passive components such as capacitors can also be mounted.

Thermally expandable particles 103 are microcapsules configured with a shell made of fine thermoplastic copolymer resin, and organic solvent contained in this shell. The shell diameter is from 1 µm to 200 µm, and preferably from 5 µm to 50 µm. The microcapsule is typically made of copolymer resin of vinyl acetate acrylonitrile, methyl methacrylate acrylonitrile, vinylidene chloride-acrylonitrile, styrene acrylonitrile, acrylonitrile styrene butadiene, ethylene vinyl acetate, or ethylene vinyl alcohol. The organic solvent may typically include one or more of the following ethylene glycol ether derivatives: diethylene glycol butylmethylether, triethylene glycol monomethyl ether, and polyethylene glycol monomethyl ether. When electronic device 130 needs repair, thermally expandable particles 103 are heated to 80~200° C., depending on the vapor pressure of each organic solvent contained in thermally expandable particles 103. Heating softens the shell made of thermoplastic copolymer resin, and at the same time increases the vapor pressure of the organic solvent inside the shell. This causes the shell to expand and stretch, resulting in peeling of adhesive 104. The expansion temperature of thermally expandable particles 103 is preferably higher than the curing temperature of adhesive 104.

Adhesive 104 may typically include one or more of the following: epoxy resin, silicone resin, and cyanate ester. Epoxy resin may typically include one or more of the following: bisphenol A, bisphenol F, biphenyl, and naphthalene.

In addition to the above composition, adhesive 104 may also typically contain one or more of the following: filler, flame retardant, pigment, curing agent, and hardening accelerator in addition to the resin component. Photoinitiator may also be added. Alternatively, adhesive 4 may be a hot-melt type prepreg resin formed in a frame shape of a predetermined width around the placement area of semiconductor device 102.

A method of manufacturing electronic device 130 in this exemplary embodiment is briefly described with reference to FIGS. 15 to 17. Solder paste is printed on lands 106 of mounting board 101 shown in FIG. 15 by typically using a metal mask and squeegee. Then, semiconductor device 102 is disposed on lands 106 of mounting board 101, and bump electrodes 105 of semiconductor device 102 are connected to lands 106 by reflow soldering. Accordingly, semiconductor device 102 is mounted on mounting board 101. This completes the connecting step.

Then, after the above connecting step, thermally expandable particles 103 are applied to dent 108 of mounting board 101 shown in FIG. 16 by typically using a dispenser. Alternatively, thermally expandable particles 103 may be applied by using a dispenser or printed using a metal mask before placing semiconductor device 102 on mounting board 101.

Next, Adhesive 104 is applied by typically using a dispenser, to the sides of semiconductor device 102 and the surface of mounting board 101 around the projected area of semiconductor device 102, as shown in FIG. 16, such that it covers thermally expandable particles 3 provided in dent 108 of mounting board 101. This completes the application step.

Lastly, semiconductor device 102 is bonded and fixed to mounting board 101 by thermally curing adhesive 104 at a curing temperature for a predetermined time. This completes the fixing step.

In electronic device 130 in this exemplary embodiment as manufactured above, thermosetting adhesive 104 suppresses strain on mounting board 101 around semiconductor device 102 caused by impact applied to mounting board 101 such as by dropping, at normal usage temperatures of the equipment. Accordingly, stress applied to the connected portion of semiconductor device 102 and mounting board 101 can be reduced, thus increasing the impact resistance.

If any failure is detected in electronic device 130 in this exemplary embodiment such that semiconductor device 102 needs to be removed from mounting board 101 for replacement, the entire electronic device 130 is heated to 80~200° C., the expansion temperature of the expanding agent, so as to soften the shells of thermally expandable particles 103. This increases the vapor pressure of the organic solvent inside the shells. Thermally expandable particles 103 in dent 108 then expand and stretch to thereby generate peeling force 109 to peel off adhesive 104 at the boundary face between the surface of mounting board 101 and adhesive 104. As a result, adhesive 104 can be peeled from mounting board 101 without leaving adhesive 104 on the surface of mounting board 101.

In a repair work (not illustrated) of electronic device 130 in this exemplary embodiment, electronic device 130 is heated up to a melting point of solder after removal of adhesive 104 from mounting board 101. This is to melt solder connecting bump electrodes 105 of semiconductor device 102 and lands 106 of mounting board 101 so as to remove defective semiconductor device 102. Then, solder paste is typically printed on lands 106 of mounting board 101. Bump electrodes 105 of new semiconductor device 102 are positioned to lands 106 of mounting board 101, and bump electrodes 105 and lands 106 are connected by reflow soldering. Lastly, thermally expandable particles 103 are provided in dent 108 of mounting board 101, adhesive 104 is applied to the sides of semiconductor device 102 and the surface of mounting board such that it covers dent 108, and adhesive 4 is then thermally cured. This completes the repair work.

Sixth Exemplary Embodiment

Figure 18:
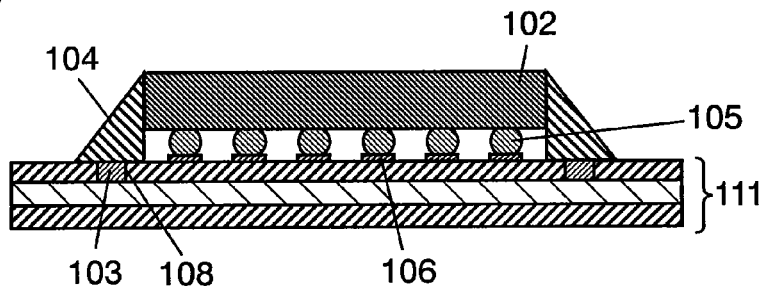
FIG. 18 is a sectional view illustrating a structure of an electronic device in accordance with a sixth exemplary embodiment of the present invention.

FIG. 18 is a sectional view illustrating a structure of electronic device 131 in the sixth exemplary embodiment of the present invention.

Electronic device 131 in this exemplary embodiment includes mounting board 111, thermally expandable particles 103, semiconductor device 102, and adhesive 104. Mounting board 111 includes lands 106 are provided at predetermined positions on one face of a laminated base material having two or more layers. Mounting board 111 is a multilayer board, and dent 108 is created around a projected area of semiconductor device 102 in the outermost layer of mounting board 111 where lands 106 are formed. Thermally expandable particles 103 contain organic solvent in their microcapsules, and are embedded in dent 108 created in the surface of mounting board 111. Bump electrodes 105 on electrodes of semiconductor device 102 are soldered to lands 106 of mounting board 111. Adhesive 104 is applied such that it covers the sides of semiconductor device 102, dent 108 in mounting board 111 where thermally expandable particles 103 are embedded, and the surface of mounting board 111 on both sides of dent 108. In other words, mounting board 111 is a multilayer board, and dent 108 passes through the outermost layer of the multilayer board where semiconductor device 102 is mounted.

Mounting board 111 has lands 106 on one face of its base material at positions corresponding to multiple bump electrodes 105 of semiconductor device 102 when mounting board 111 and semiconductor device 102 face each other. A thickness of the base material of multilayer semiconductor device 102 on the side where semiconductor device 102 is connected is from 20 μm to 150 μm, and preferably from 30 μm to 100 μm. Dent 108 in mounting board 111 has a predetermined width and a depth same as the thickness of the base material on which semiconductor device 102 is mounted. This dent 109 is created around semiconductor device 102 at outside of a rim of the placement area of semiconductor device 102 when semiconductor device 102 is mounted on mounting board 111.

The base material of mounting board 111 and a material of conductor in this exemplary embodiment are the same as those used in the fifth exemplary embodiment, and thus their description is omitted here.

Thermally expandable particles 103, semiconductor device 102, and adhesive 104 used in this exemplary embodiment are also the same as those used in the fifth exemplary embodiment, and thus their description is omitted here.

In electronic device 131 as configured above, in which semiconductor device 102 in this exemplary embodiment is installed, the sides of semiconductor device 102 and the surface of mounting board 111 are firmly bonded and fixed by thermosetting adhesive 104. Accordingly, strain on mounting board 111 around semiconductor device 102 is suppressed even if impact is applied to mounting board 111, such as by dropping, under temperatures for normal use of equipment. This suppresses peeling at a soldered portion of mounting board 111, thus increasing the impact resistance. If any failure is detected in electronic device 131 in this exemplary embodiment such that semiconductor device 102 needs to be removed from mounting board 111 for replacement, the entire electronic device 131 is heated to 80~200° C. so as to both soften the shells of thermally expandable particles 103 and increase the vapor pressure of the organic solvent inside the shells. This thermally expands the thermally expandable particles 103 in dent 108 of mounting board 111. A peeling force is thereby generated at the boundary face between the surface of mounting board 111 and adhesive 104. As a result, adhesive 104 can be peeled from mounting board 111 without leaving adhesive 104 on mounting board 111. Still more, dent 108 created in mounting board 111 is created in the base material of laminated mounting board 111 where semiconductor device 102 is connected. Accordingly, dent 108 is sufficiently deep for embedding a large amount of thermally expandable particles 103. Thermally expandable particles 103 are thus sufficiently expanded in volume to the extent to remove adhesive 104 from mounting board 111 by heating thermally expandable particles 103 provided between mounting board 111 and adhesive 104. Accordingly, mounting board 111 after removal has a clean surface without adhesive residue.

A repair work (not illustrated) of electronic device 131 in this exemplary embodiment is the same as that in the fifth exemplary embodiment, and thus its detailed description is omitted here.

Deep dent 108 can be easily created in mounting board 111 just by forming a dent pattern for dent 108 in a process of manufacturing a base material for the outermost layer of mounting board 111. The conventional step of shaving off adhesive 4, typically using of a knife, can be eliminated. Accordingly, a significant reduction in man-hours and of wastage of boards are achievable.

Seventh Exemplary Embodiment

Figure 19:
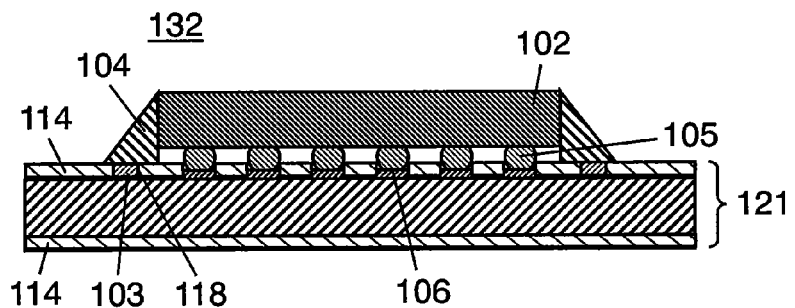
FIG. 19 is a sectional view illustrating a structure of the electronic device in accordance with the seventh exemplary embodiment of the present invention.

FIG. 19 is a sectional view illustrating a structure of electronic device 132 in which BGA-type semiconductor device 102 is mounted on mounting board 121 in the seventh exemplary embodiment of the present invention.

Electronic device 132 in this exemplary embodiment includes semiconductor device 102, mounting board 121 with dent 118 created in insulating film 114, thermally expandable particles 103 embedded in dent 118, and adhesive 104. Adhesive 104 is applied around semiconductor device 102 such that it covers and bonds the sides of semiconductor device 102, over dent 118 in mounting board 121 where thermally expandable particles 103 are embedded, and insulating film 114 on both sides of dent 118.

In this exemplary embodiment, insulating film 114 is formed on one or both faces of mounting board 121, and openings are created in insulating film 114 over lands 106 where bump electrodes 105 of semiconductor device 102 are connected. Insulating film 114 has dent 118 at a position around the placement area of semiconductor device (that is, an area around the projected area of semiconductor device). In other words, mounting board 121 has insulating film 114 on its mounting face of semiconductor device 102, and dent 118 is created in insulating film 114.

A base material of mounting board 121 in this exemplary embodiment is glass epoxy resin, and it may be a single layer or laminated structure of one or more of the following: BT resin, polyimide resin, polyamide resin, polyester resin, benzoxazol resin, Teflon® resin, and paper epoxy resin. Still more, the base material may be a single layer or laminated structure of oxidized aluminum or aluminum nitride.

If a resin board is used as mounting board 121, insulating film 114 is made of solder resist of epoxy resin with a thickness from 10 µm to 50 µm, and preferably 20 µm to 30 µm. If a ceramic board is used as mounting board 121, insulating film 114 is made of solder resist or frit glass of epoxy resin.

The conductor is copper foil, but a metal layer may also be formed on the copper foil. The metal layer is typically one or more of the following: solder, gold, silver, nickel, and palladium.

Thermally expandable particles 103, semiconductor device 102, and adhesive 104 used in this exemplary embodiment are the same as those used in the fifth exemplary embodiment, and thus their description is omitted here.

In electronic device 132 in which semiconductor device 102 in this exemplary embodiment as configured above is installed, thermosetting adhesive 104 firmly bonds and fixes the sides of semiconductor device 2 and the surface of mounting board 121 at temperatures at which the equipment is normally used. Accordingly, strain on mounting board 121 around semiconductor device 102 is suppressed, even if impact is applied to mounting board 1 such as by dropping. This enables suppression of peeling at a soldered portion of mounting board 121, thus increasing the impact resistance.

If any failure is detected in electronic device 132 in this exemplary embodiment such that semiconductor device 102 needs to be removed from mounting board 121 for replacement, the entire electronic device 132 is heated to 80~200° C. so as to both soften the shells and increase the vapor pressure of the organic solvent inside the shells. This thermally expands thermally expandable particles 103 in dent 118. A peeling force is thereby generated at the boundary face between mounting board 121 and adhesive 104. As a result, adhesive 104 can be peeled from mounting board 1 without leaving adhesive 104 on mounting board 121. In addition, dent 118 in the insulating film can be easily formed at an accurate position by creating an opening pattern and a dent pattern simultaneously on each land 106 in a mask pattern formation of the insulating film in a manufacturing process of mounting board 121.

A repair work (not illustrated) of electronic device 132 in this exemplary embodiment is the same as that in the fifth exemplary embodiment, and their detailed description is omitted here.

As described above, dent 118 can be easily and accurately created just by creating a pattern of insulating film 114 on designing mounting board 121. The conventional step of shaving off adhesive 4, typically using of a knife, can also be eliminated. Accordingly, a significant reduction in man-hours and of wastage of boards are achievable.

Eighth Exemplary Embodiment

Figure 20:
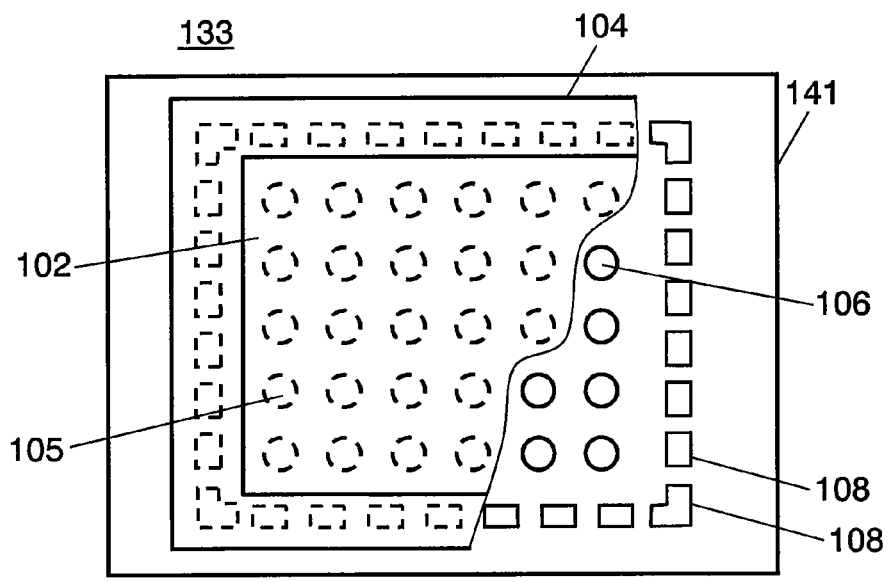
FIG. 20 is a partly cutaway plan view illustrating a structure of the electronic device in accordance with an eighth exemplary embodiment of the present invention.

FIG. 20 is a partly cutaway plan view of electronic device 133 in the eighth exemplary embodiment of the present invention. To facilitate understanding of a structure of mounting board 141, a part of semiconductor device 102 and adhesive 104 are removed in FIG. 20.

Electronic device 133 in this exemplary embodiment includes mounting board 141, thermally expandable particles 103, semiconductor device 102 with bump electrodes 105, and adhesive 104. Mounting board 141 includes multiple lands 106 disposed at predetermined positions on one face, and dents 108 at discontinuous points with a distance in between on an area around the projected area of semiconductor device 102. Thermally expandable particles 103 are embedded in dents 108 on mounting board 141, and contain organic solvent in microcapsules.

Adhesive 104 covers and bonds the sides of semiconductor device 102, over dents 108 in mounting board 141 where thermally expandable particles are embedded, both sides of dents 108, and discontinuous points between dents 108. If any failure is detected in electronic device 133 such that semiconductor device 102 needs to be repaired, the entire electronic device 133, in which semiconductor device 102 is connected to mounting board 141, is heated to 80~200° C., depending on the expansion temperature of thermally expandable particles 103, so as to increase the vapor pressure of the organic solvent in thermally expandable particles 103. A peeling force is thereby generated at the boundary face between mounting board 141 and adhesive 104. As a result, adhesive 104 can be peeled from mounting board 141 without leaving adhesive 104 on mounting board 1.

Mounting board 141 has lands 106 disposed at positions corresponding to multiple bump electrodes 105 of semiconductor device 102, respectively, on one face of its base material when mounting board 141 and semiconductor device 102 are facing each other. Mounting board 141 also includes dents 108 provided at discontinuous points with a distance in between around semiconductor device 102 at outside the rim of the placement area of semiconductor device 102 when semiconductor device 102 is mounted on mounting board 141. Dents 108 have a predetermined width and depth. This structure is applicable to any of the mounting boards in the fifth to seventh exemplary embodiments.

A base material of mounting board 141 and a material of a conductor in this exemplary embodiment are the same as those used in the fifth to seventh exemplary embodiments, and thus their description is omitted here.

Thermally expandable particles 103, semiconductor device 102, and adhesive 104 used in this exemplary embodiment are also the same as those used in the fifth to seventh exemplary embodiments, and thus their description is omitted.

In electronic device 133 in this exemplary embodiment as configured above, in which semiconductor device 102 is installed, a larger adhesion area between adhesive 104 and mounting board 141 can be secured, compared to electronic devices 130 to 132 in the fifth to seventh exemplary embodiments because dents 108 are provided at discontinuous points on mounting board 141. In electronic device 133 using this mounting board 141, adhesive 104, mainly containing thermosetting resin, firmly bonds and fixes the sides of semiconductor device 102 and the surface of mounting board 141 at temperatures at which the equipment is normally used, due to the above reason. Accordingly, strain on mounting board 141 around semiconductor device 102 is suppressed, even if an impact is applied to mounting board 141 such as by dropping. This enables suppression of peeling at a soldered portion of mounting board 141, thus increasing the impact resistance. If any failure is detected in electronic device 133 such that semiconductor device 102 needs to be removed from mounting board 141 for replacement, the entire electronic device 133 is heated to 80~200° C. so as to both soften the shells of thermally expandable particles 103 and increase the vapor pressure of the organic solvent inside the shells. This thermally expands thermally expandable particles 103 in dents 108 provided at discontinuous points on mounting board 141. A peeling force is thereby generated at the boundary face between mounting board 141 and adhesive 104. As a result, adhesive 104 can be peeled from mounting board 141 without leaving adhesive 104 on mounting board 1. In addition, since dents 108 are provided at discontinuous points with an appropriate distance in between on mounting board 141, thermally expandable particles 103 expands at multiple points by heating electronic device 133 to the expansion temperature of thermally expandable particles 103. This generates a peeling force efficiently, and thus semiconductor device 102 can be removed such that a clean surface remains on mounting board 141.

A repair work (not illustrated) of electronic device 133 is this exemplary embodiment is the same as that in the fifth exemplary embodiment, and thus its detailed description is omitted here.

The conventional step of shaving off adhesive 4, typically using a knife, can thus be eliminated. Accordingly, a significant reduction in man-hours, costs by decreasing the amount of thermally expandable particles 103, and of wastage of boards are achievable.

Ninth Exemplary Embodiment

Figure 21A:
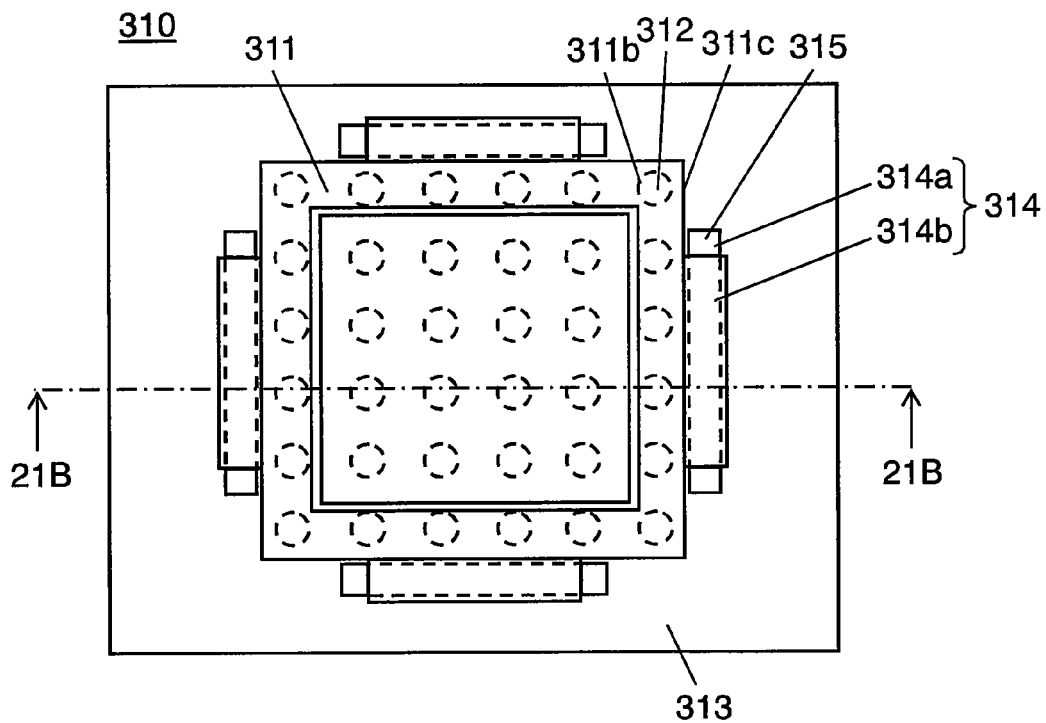
FIG. 21A is a schematic plan view of an electronic device in accordance with a ninth exemplary embodiment of the present invention.
Figure 21B:
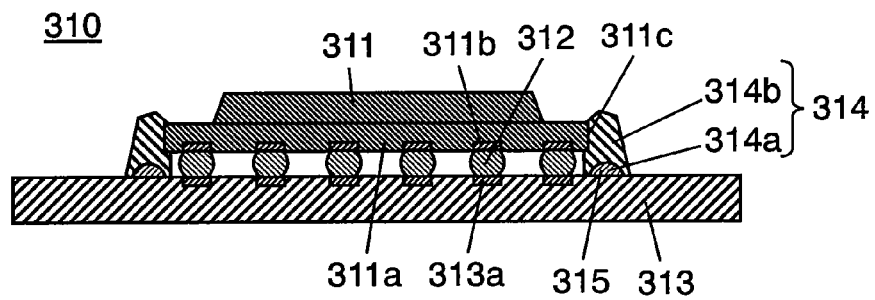
FIG. 21B is a sectional view taken along line 21B-21B in FIG. 21A.

FIG. 21A is a schematic plan view of electronic device 310 in the ninth exemplary embodiment of the present invention. FIG. 21B is a sectional view taken along line 21B-21B in FIG. 21A.

As shown in FIGS. 21A and 21B, electronic device 310 includes semiconductor device 311 in which electrodes 311b are aligned on one main face 311a, and mounting board 313 having board electrode 313a that is electrically connected to electrodes 311b of semiconductor device 311 by solder bumps 312. Curable resin 31f bonds and fixes at least a part of sides 311c of semiconductor device 311 and mounting board 313. Thermally expandable particles 315 are mixed in at least a part of boundary area 314a between curable resin 314 and mounting board 313. Accordingly, boundary area 314a shown in FIGS. 21A and 21B is a part of curable resin 314 in which thermally expandable particles 315 are mixed, and adhesion area 314b is also a part of curable resin 314. Adhesive made of curable resin 314 bonds and fixes mounting board 313.

In electronic device 310 shown in FIG. 21A, as configured above, semiconductor device 311 is electrically and mechanically connected to mounting board 313 by solder bumps 312. Apart of at least sides 311c of semiconductor device 311 is mechanically connected to mounting board 313 by curable resin 314 in order to reduce impact applied to a portion connected by solder bump 312 when equipment in which electronic device 310 is built in receives impact such by dropping. This structure strengthens the impact resistance of the portion connected by solder bump 312 between semiconductor device 311 and mounting board 313 configuring electronic device 310. In other words, since thermally expandable particles 315 are provided at discontinuous points on mounting board 313 around the projected area of semiconductor device 311, impact caused such as by dropping applied to equipment where electronic device 310 is built in is dispersed from portions connected by solder bump 312 to mechanically connected portions at discontinuous points. This strengthens the impact resistance.

However, repair or reworking becomes more difficult, in general, when any characteristic failure is found in semiconductor device 311 already mounted in equipment in an inspection if the impact resistance of electronic device 310 is increased. However, in case of electronic device 310 in this exemplary embodiment, curable resin 314 is heated to thermally expand thermally expandable particles 315 mixed in boundary area 314a of curable resin 314 so as to break adhesion between curable resin 314 and mounting board 313 in advance, when repair or reworking is needed. Then, semiconductor device 311 can be separated and removed from mounting board 313 by heating and melting solder bumps 312 at a temperature not less than its melting point. In this exemplary embodiment, expansion temperature T1 of thermally expandable particles 315 is set to be higher than curing temperature Ts of curable resin 314 and not higher than 260° C. This is because adhesion of semiconductor device 311 and mounting board 313 by curable resin 314 is made feasible only when expansion temperature T1 is higher than curing temperature Ts. In addition, expansion temperature T1 higher than 260° C. may damage semiconductor device 311 and other components on mounting board 313 by heat.

Accordingly, the above structure shows high impact resistance when semiconductor device 311 is mounted on mounting board 313, and allows easy removal of semiconductor device 311 from mounting board 313 when repair or reworking is needed. In other words, the impact resistance is increased by bonding and fixing sides 311c of semiconductor device 311 and mounting board 313 by curable resin 314. When repair or reworking is needed, thermally expandable particles 315 in curable resin 314 applied to boundary area 314a are expanded so as to remove semiconductor device 311 and curable resin 314 from the adhesion boundary between mounting board 313 and curable resin 314. This makes the adhesion boundary fragile, enabling easy removal of semiconductor device 311 from mounting board 313. Curable resin mainly contains so-called thermosetting resin that hardens by polymerization, such as three-dimensional cross-linking, of a low molecular compound containing polymer group such as epoxy group or acrylate group in its molecular structure triggered by an external stimulus such as light or heat.

Figure 22:
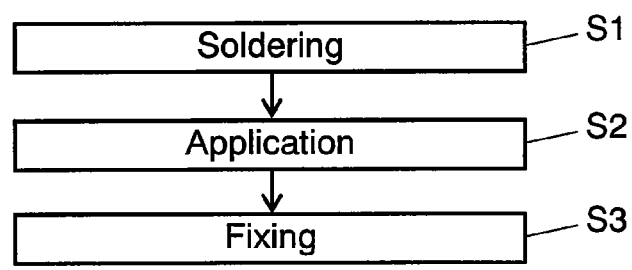
FIG. 22 is a manufacturing flow chart illustrating a method of manufacturing the electronic device in accordance with the ninth exemplary embodiment of the present invention.

Next a method of manufacturing electronic device 310 in this exemplary embodiment is described. FIG. 22 is a flow chart of a manufacturing method of electronic device 310 in this exemplary embodiment. FIGS. 23A to 23D are schematic sectional views illustrating the manufacturing method of electronic device 310.

Figure 23A:
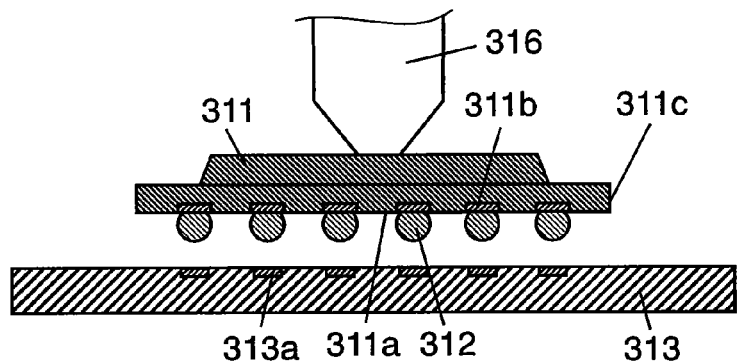
FIG. 23A is a schematic sectional view illustrating the method of manufacturing the electronic device in accordance with the ninth exemplary embodiment of the present invention.
Figure 23B:
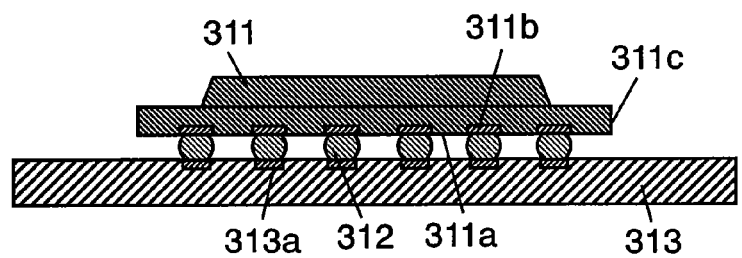
FIG. 23B is a schematic sectional view illustrating the method of manufacturing the electronic device in accordance with the ninth exemplary embodiment of the present invention.

As shown in FIG. 22, the manufacturing method of electronic device 310 in this exemplary embodiment includes soldering step S1, application step S2, and fixing step S3. FIG. 23A shows a process of carrying semiconductor device 311 to mounting board 313 by vacuum chuck 316 for soldering. As shown in FIGS. 23A and 23B, soldering step S1 is the step of electrically connecting electrodes 311b aligned on one main face 311a of semiconductor device 311 to board electrodes 313a on circuit board 313 by solder bumps 312. In FIG. 23B, solder bumps 312 are heated and melted typically at 230° C., and then cooled down to electrically connect electrodes 311b of semiconductor device 311 and board electrodes 313a of mounting board 313. Solder bumps 312 are ball-shaped solder bumps 312 made of lead-free solder materials that are Sn-3.0% Ag-0.5% Cu. The melting point of solder bumps 312 made of Sn-3.0% Ag-0.5% Cu is 217° C.

Figure 23C:
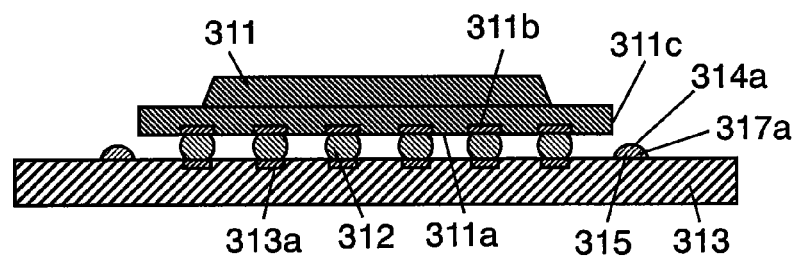
FIG. 23C is a schematic sectional view illustrating the method of manufacturing the electronic device in accordance with the ninth exemplary embodiment of the present invention.
Figure 23D:
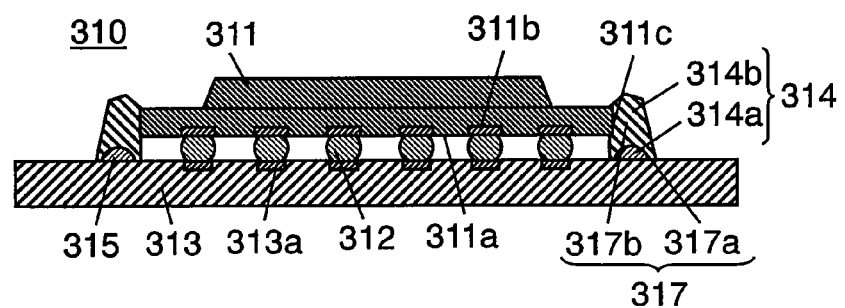
FIG. 23D is a schematic sectional view illustrating the method of manufacturing the electronic device in accordance with the ninth exemplary embodiment of the present invention.

As shown in FIGS. 23C and 23D, application step S2 is the step of applying thermosetting adhesive 317b for bonding and fixing to at least a part of sides 311c of semiconductor device 311 and mounting board 313. Then in fixing step S3, adhesive 317 applied in application step S2 is thermally cured into curable resin 314 so as to bond and fix semiconductor device 311 and mounting board 313.

In application step S2, as shown in FIG. 23C, thermally expandable particles 315 are provided on at least a part of the surface of mounting board 313 around the projected area of semiconductor 311, and then thermosetting adhesive 317b is applied to mounting board 313 and sides 311c of semiconductor device 311 over thermally expandable particles 315, as shown in FIG. 23D, so as to form adhesion area 314b. Fixing step S3 of bonding and fixing semiconductor device 311 and mounting board 313 by curable resin 314 increases the impact resistance of electronic device 310. In this exemplary embodiment, curable resin 314 is adhesive typically made of epoxy resin, and heated and cured at 120° C. In application step S2 in this exemplary embodiment, thermally expandable adhesive 317a in which thermally expandable particles 315 are mixed is applied. However, dispersion liquid in which thermally expandable particles are dispersed in volatile solvent is also applicable.

Thermally expandable particles 315 mixed in thermally expandable adhesive 317a are made of a material that thermally expands at a temperature higher than a curing temperature of adhesive (e.g. 120° C. in case of epoxy resin) that becomes curable resin 314, and not higher than 260° C. that gives damage to the semiconductor device and components mounted on mounting board 313. In this exemplary embodiment, thermally expandable microcapsules, in which resin shells with a diameter of several micrometers to several tens of micrometers made typically of acryl, are mixed with silicone application liquid. Carbon hydride is typically contained in each of the microcapsules.

The above method enables the manufacture of electronic device 310 that shows high impact resistance when semiconductor device 311 is mounted on mounting board 313, and allows easy removal of semiconductor device 311 from mounting board 313 when repair or reworking is needed.

Figure 24A:
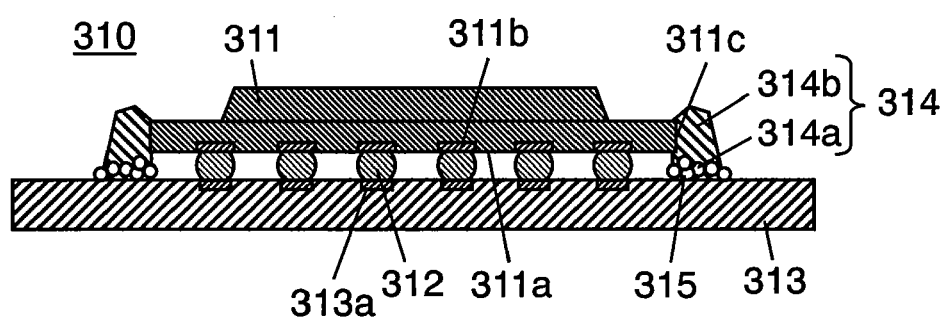
FIG. 24A is a schematic sectional view illustrating a method of removing a semiconductor device in accordance with the ninth exemplary embodiment of the present invention.
Figure 24B:
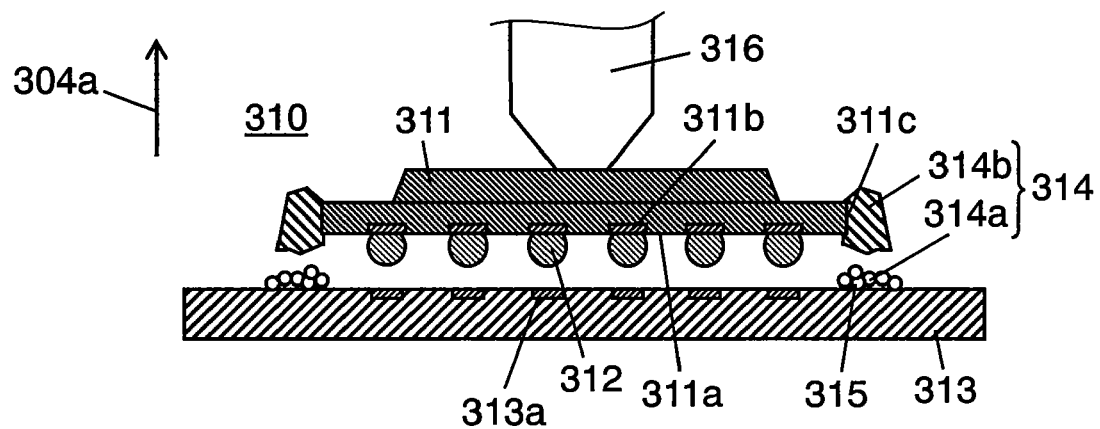
FIG. 24B is a schematic sectional view illustrating the method of removing a semiconductor device in accordance with the ninth exemplary embodiment of the present invention.

Next a method of removing semiconductor device 311 from electronic device 310 is described. FIGS. 24A and 24B are schematic sectional views illustrating a removal method of semiconductor device 311 in this exemplary embodiment.

As shown in FIG. 24A, curable resin 314 is heated typically by a heater (not illustrated) to a temperature higher than the curing temperature (e.g. 120° C. in this case) and not higher than melting point Tm of solder bump 312 (e.g. 217° C. in this case), such as at 180° C., so as to thermally expand thermally expandable particles 315 in electronic device 310 in this exemplary embodiment. At this point, thermally expandable particles 315 expand to 2- to 10-fold compared to before expansion. This thermal expansion causes peeling of bonded portions between curable resin 314 and mounting board 313. Accordingly, semiconductor device 311 bonded and fixed by curable resin 314 can be removed from mounting board 313 by holding semiconductor device 311 typically with vacuum chuck 316, and lifting it in a direction shown by arrow 304a. Thermally expandable particles 315 in the expanded form mainly remains on mounting board 313, and they are not bonded to mounting board 313. Accordingly, these thermally expandable particles 315 can be easily removed from mounting board 313.

This method minimizes stress applied to the mounting board during repair or reworking, and also facilitates removal of the semiconductor device from the mounting board. In addition, thermally expandable particles finely break all of the curable resin. Therefore, almost no curable resin residue remains on the mounting board after repair.

Tenth Exemplary Embodiment

Figure 25A:
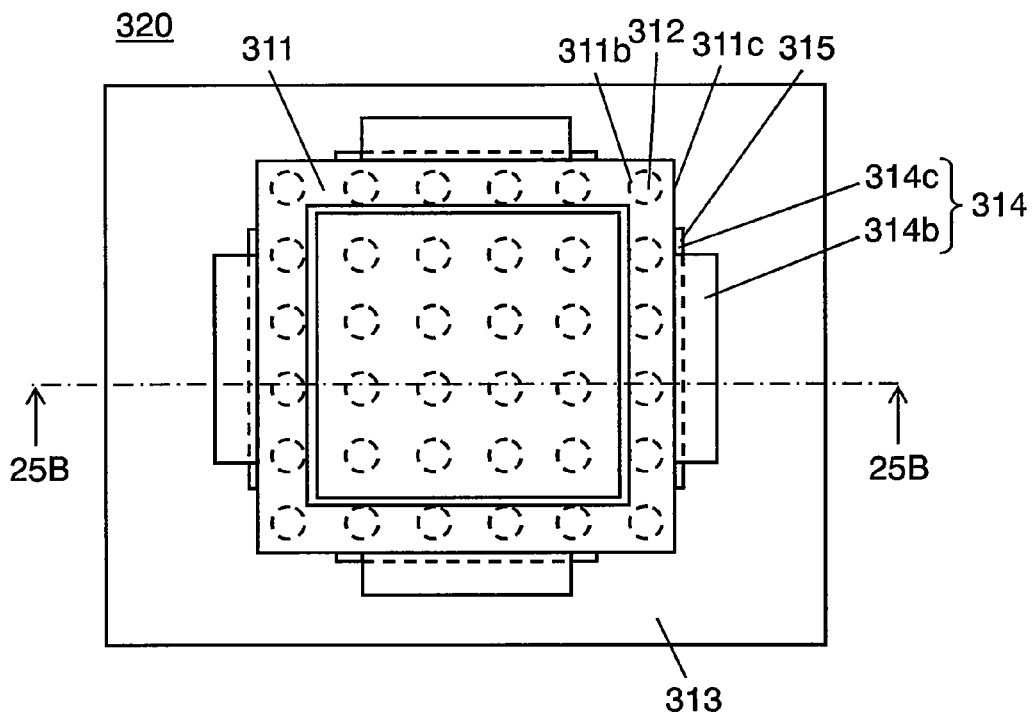
FIG. 25A is a plan view illustrating a schematic structure of an electronic device in accordance with a tenth exemplary embodiment of the present invention.
Figure 25B:
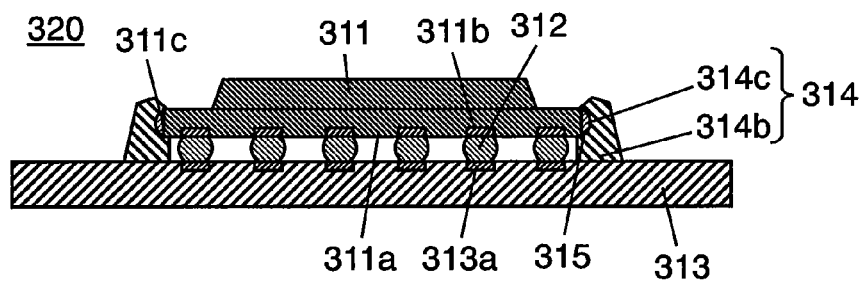
FIG. 25B is a sectional view taken along line 25B-25B in FIG. 25A.

FIG. 25A is a plan view illustrating a schematic structure of electronic device 320 in the tenth exemplary embodiment of the present invention. FIG. 25B is a sectional view taken along line 25B-25B in FIG. 25A in this exemplary embodiment.

As show in FIGS. 25A and 25B, electronic device 320 includes semiconductor device 311 in which electrodes 311b are aligned on one main face 311a, and mounting board 313 having board electrodes 313a electrically connected to electrodes 311b of semiconductor device 311 by solder bumps 312. Curable resin 314 bonds and fixes at least a part of sides 311c of semiconductor device 311 and mounting board 313. Thermally expandable particles 315 are mixed in at least a part of boundary area 314c between curable resin 314 and sides 311c of semiconductor device 311. Accordingly, boundary area 314c shown in FIGS. 25A and 25B is a part of curable resin 314 in which thermally expandable particles 315 are mixed, and adhesion area 314b is also a part of curable resin 314. In other word, unlike the ninth exemplary embodiment, an area where thermally expandable particles 315 are mixed is boundary area 314c adjacent to sides 311c. In addition, a part of sides 311c of semiconductor device 311 is bonded and fixed by adhesive made of curable resin 314.

In electronic device 320 shown in FIGS. 25A and 25B, as configured above, semiconductor device 311 is electrically and mechanically connected to mounting board 313 by solder bumps 312. Curable resin 314 mechanically connects at least a part of sides 311c of semiconductor device 311 and mounting board 313 so that impact applied to portions connected by solder bumps 312 can be reduced when equipment in which electronic device 320 is installed receives impact such as by dropping. This structure increases the impact resistance of the portion connected by solder bumps 312 in semiconductor device 311 and mounting board 313 that configure electronic device 320.

However, repair or reworking becomes more difficult, in general, when any characteristic failure is found in semiconductor device 311 already mounted in equipment in an inspection if the impact resistance of electronic device 320 is increased. However, in case of electronic device 310 in this exemplary embodiment, curable resin 314 is heated to thermally expand thermally expandable particles 315 mixed in boundary area 314a of curable resin 314 so as to break adhesion between curable resin 314 and sides 311 of semiconductor device 311 in advance, when repair or reworking is needed. Then, semiconductor device 311 can be separated and removed from mounting board 313 and curable resin 314 by heating and melting solder bumps 312 at a temperature not less than its melting point. The removing step of removing bonded and fixed semiconductor device 311 from mounting board 313 completes in this way. Same as the ninth exemplary embodiment, expansion temperature T1 of thermally expandable particles 315 is set to be higher than curing temperature Ts of curable resin 314 and not higher than 260° C.

Accordingly, the above structure shows high impact resistance when semiconductor device 311 is mounted on mounting board 313, and allows easy removal of semiconductor device 311 from mounting board 313 when repair or reworking is needed. In other words, the impact resistance is increased by bonding and fixing sides 311c of semiconductor device 311 and mounting board 313 by curable resin 314. When repair or reworking is needed, thermally expandable particles 315 in curable resin 314 applied to boundary area 314c are expanded so as to remove semiconductor device 311 and curable resin 314 from the adhesion boundary between sides 311c of semiconductor device 311 and curable resin 314. This makes the adhesion boundary fragile, enabling easy removal of semiconductor device 311 from mounting board 313 and curable resin 314.

Figure 26:
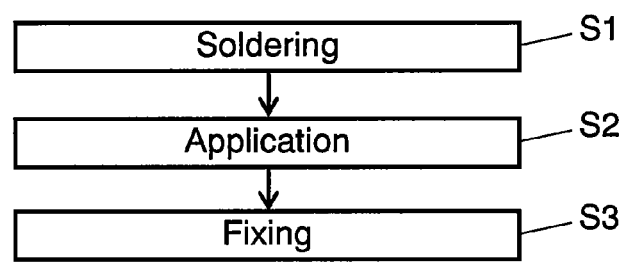
FIG. 26 is a manufacturing flow chart illustrating a method manufacturing the electronic device in accordance with the tenth exemplary embodiment of the present invention.

Next a method of manufacturing electronic device 320 in this exemplary embodiment is described. FIG. 26 is a flow chart of a manufacturing method of electronic device 320 in this exemplary embodiment. FIGS. 27A to 27D are schematic sectional views illustrating the manufacturing method of electronic device 320.

Figure 27A:
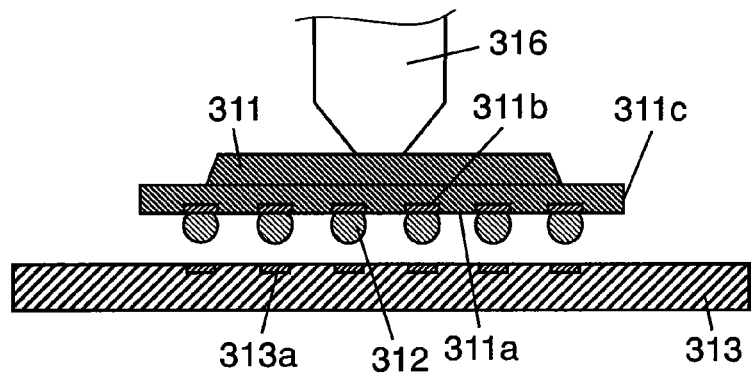
FIG. 27A is a schematic sectional view illustrating the method of manufacturing the electronic device in accordance with the tenth exemplary embodiment of the present invention.
Figure 27B:
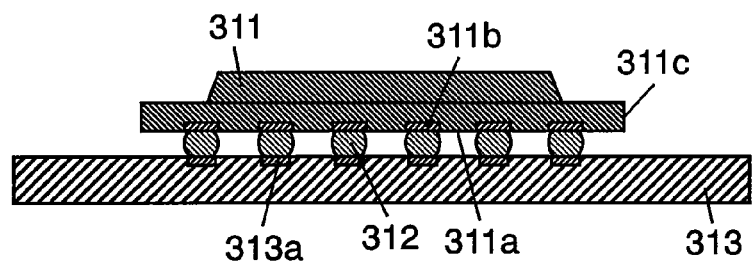
FIG. 27B is a schematic sectional view illustrating the method of manufacturing the electronic device in accordance with the tenth exemplary embodiment of the present invention.

As shown in FIG. 26, the manufacturing method of electronic device 320 in this exemplary embodiment includes soldering step S1, application step S2, and fixing step S3. FIG. 23A shows a process of carrying semiconductor device 311 to circuit board 313 by vacuum chuck 316 for soldering. As shown in FIGS. 27A and 27B, soldering step S1 is the step of electrically connecting electrodes 311b aligned on one main face 311a of semiconductor device 311 to board electrodes 313a on circuit board 313 by solder bumps 312. In FIG. 27B, solder bumps 312 are heated and melted typically at 230° C., and then cooled down to electrically connect electrodes 311b of semiconductor device 311 and board electrodes 313a of circuit board 313. Solder bumps 312 are ball-shaped solder bumps 312 made of lead-free solder materials that are Sn-3.0% Ag-0.5% Cu. The melting point of solder bumps 312 made of Sn-3.0% Ag-0.5% Cu is 217° C.

Figure 27C:
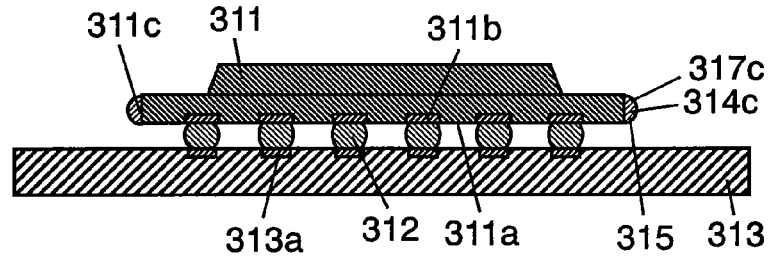
FIG. 27C is a schematic sectional view illustrating the method of manufacturing the electronic device in accordance with the tenth exemplary embodiment of the present invention.
Figure 27D:
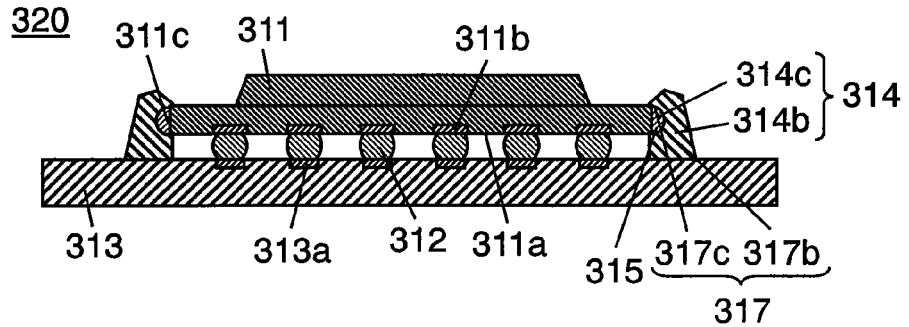
FIG. 27D is a schematic sectional view illustrating the method of manufacturing the electronic device in accordance with the tenth exemplary embodiment of the present invention.

As shown in FIGS. 27C and 27D, application step S2 is the step of applying thermosetting adhesive 317b for bonding and fixing to at least a part of sides 311c of semiconductor device 311 and mounting board 313. Then in fixing step S3, adhesive 317 applied in application step S2 is thermally cured into curable resin 314 so as to bond and fix semiconductor device 311 and mounting board 313.

In application step S2, as shown in FIG. 27C, thermally expandable particles 315 are provided on at least a part of sides 311c of semiconductor 311, and then thermosetting adhesive 317b is applied to mounting board 313 and sides 311c of semiconductor device 311 over thermally expandable particles 315, as shown in FIG. 23D, so as to form adhesion area 314b. Bonding and fixing of semiconductor device 311 and mounting board 313 by curable resin 314 increases impact resistance of electronic device 320. Same as in the ninth exemplary embodiment, curable resin 314 is adhesive typically made of epoxy resin, and heated and cured at 120° C. in this exemplary embodiment. In application step S2 in this exemplary embodiment, thermally expandable adhesive 317c in which thermally expandable particles 315 are mixed is applied. However, dispersion liquid in which thermally expandable particles are dispersed in volatile solvent is also applicable.

Thermally expandable particles 315 mixed in thermally expandable adhesive 317c are made of a material that thermally expands at a temperature higher than a curing temperature of adhesive (e.g. 120° C. in case of epoxy resin) that becomes curable resin 314, and not higher than 260° C. that gives damage to the semiconductor device and components mounted don mounting board 313. Same as in the ninth exemplary embodiment, thermally expandable microcapsules, in which resin shells with a diameter of several micrometers to several tens of micrometers made typically of acryl, are mixed with silicone application liquid in this exemplary embodiment. Carbon hydride is typically contained in each of the microcapsules.

The above method enables the manufacture of electronic device 310 that shows high impact resistance when semiconductor device 311 is mounted on mounting board 313, and allows easy removal of semiconductor device 311 from mounting board 313 when repair or reworking is needed.

Figure 28A:
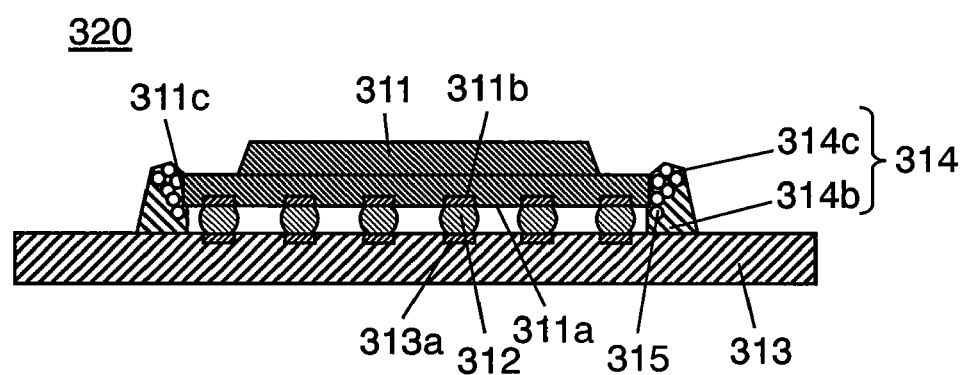
FIG. 28A is a schematic sectional view illustrating a method of removing a semiconductor device in accordance with the tenth exemplary embodiment of the present invention.
Figure 28B:
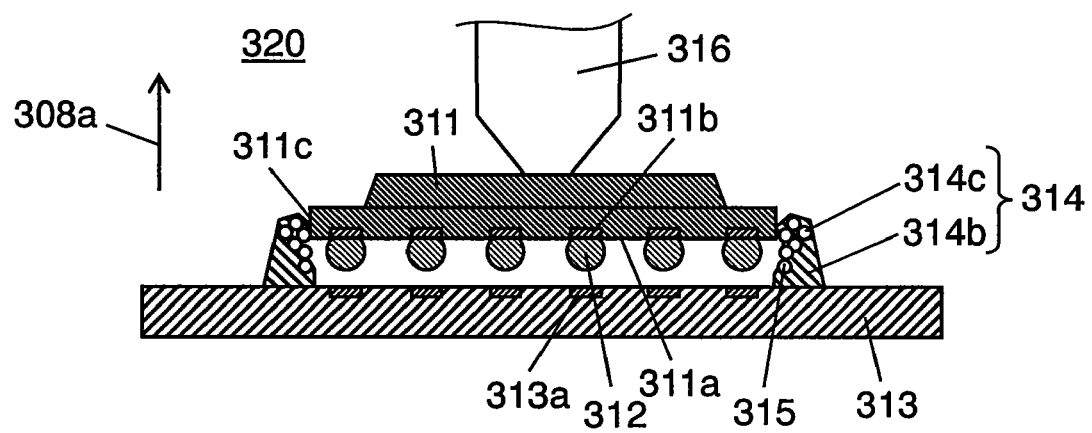
FIG. 28B is a schematic sectional view illustrating the method of removing the semiconductor device in accordance with the tenth exemplary embodiment of the present invention.
Figure 29:
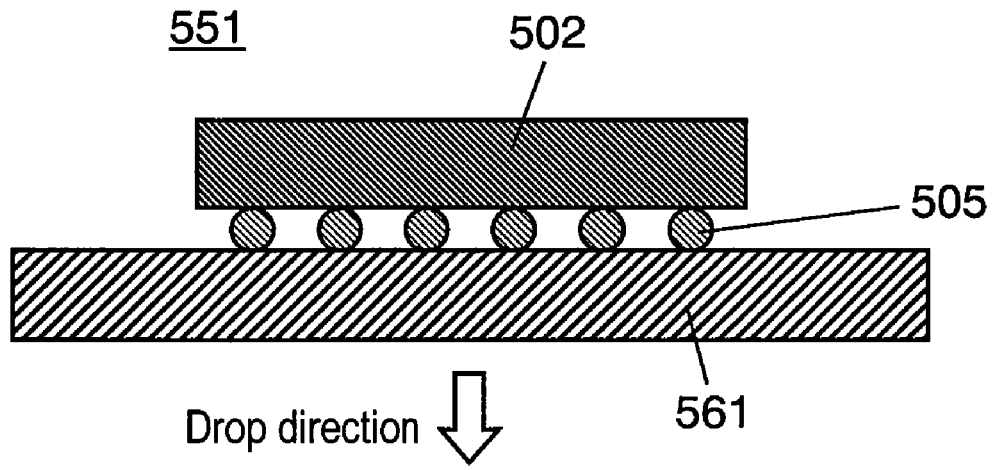
FIG. 29 is a schematic sectional view of a conventional electronic device.
Figure 30:
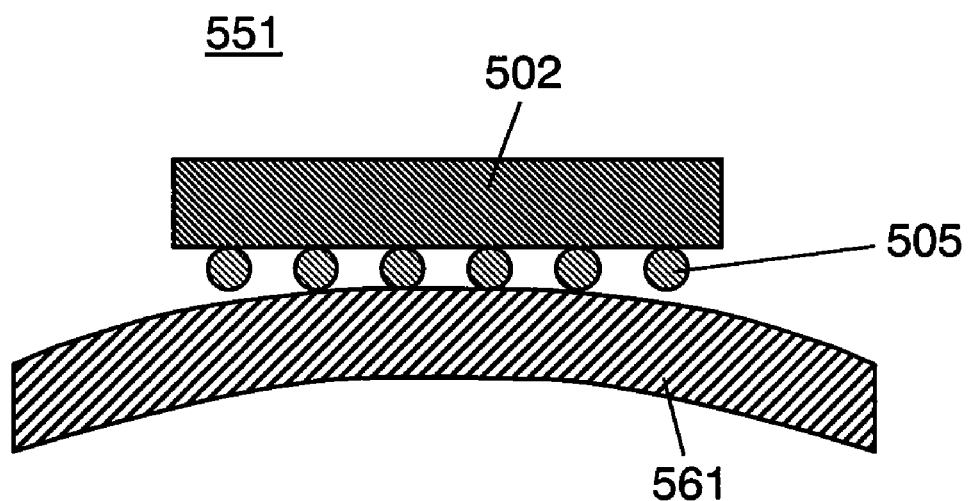
FIG. 30 is a schematic sectional view illustrating a state that a mounting board of the conventional electronic device is warped.
Figure 31A:
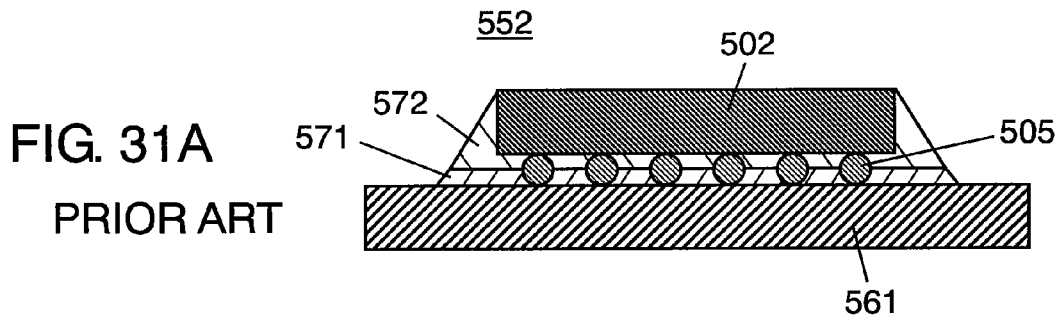
FIG. 31A is a sectional view of a two-layer structure of a peelable and removable resin layer and a layer with high mechanical strength in the conventional electronic device.
Figure 31B:
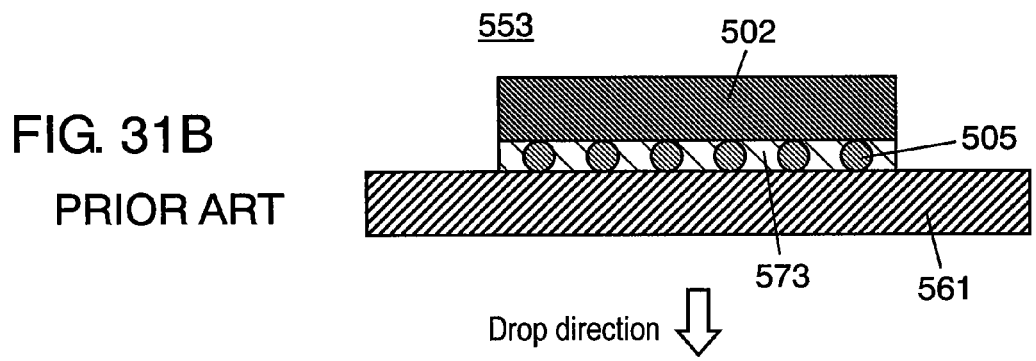
FIG. 31B is a sectional view of a structure of the conventional electronic device reinforced by underfill.
Figure 31C:
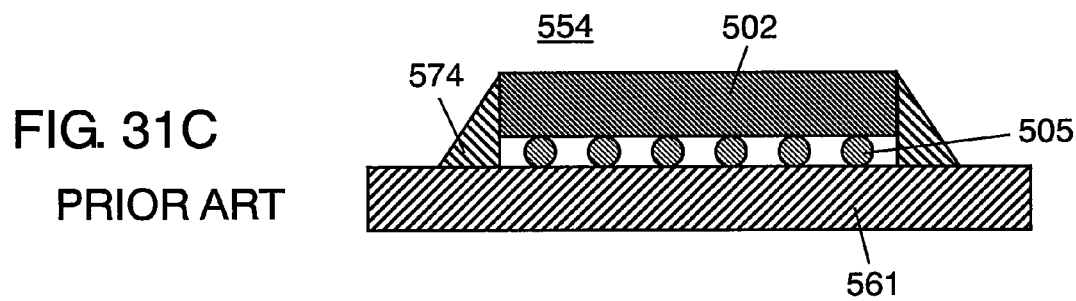
FIG. 31C is a sectional view of a structure of the conventional electronic device reinforced by adhesive.
Figure 31D:
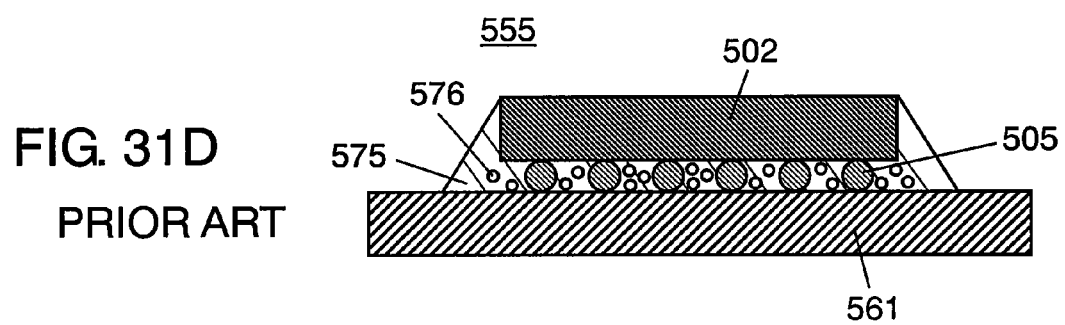
FIG. 31D is a sectional view of a structure of the conventional electronic device reinforced by underfill in which thermally expandable particles and adhesive are mixed.

Next a method of removing semiconductor device 311 from electronic device 320 is described. FIGS. 28A and 28B are schematic sectional views illustrating a removal method of semiconductor device 311 in this exemplary embodiment.

Same as in the ninth exemplary embodiment, curable resin 314 is heated typically by a heater (not illustrated) to a temperature higher than the curing temperature (e.g. 120° C. in this case) and not higher than melting point Tm of solder bump 312 (e.g. 217° C. in this case), such as at 180° C., so as to thermally expand thermally expandable particles 315 in electronic device 320 in this exemplary embodiment, as shown in FIG. 28A. At this point, thermally expandable particles 315 expand to 2- to 10-fold compared to before expansion. This thermal expansion of thermally expandable particles 315 on boundary area 31c of sides 311c of semiconductor device 311 causes fine breakage of curable resin 314 on adhesion area 314b so that a bonded portion of curable resin 314 and sides 311c of semiconductor device 311 can be separated, as shown in FIG. 28A. Then, semiconductor device 311 bonded and fixed by curable resin 314 is lifted in a direction shown by arrow 304a in FIG. 28B typically with vacuum chuck 316. Accordingly, semiconductor device 311 can be removed from mounting board 313 and curable resin 314 while leaving curable resin 314 and thermally expandable particles 315 on mounting board 313.

This method minimizes stress applied to the mounting board during repair or reworking, and also facilitates removal of the semiconductor device from the mounting board.

By adopting the structure and method described in the ninth and tenth exemplary embodiments, the electronic device shows high impact resistance when the semiconductor device is mounted on the mounting board, and allows easy removal of the semiconductor device from the mounting board when repair or reworking is needed. Adhesive forming curable resin is applied only on at least a part of the sides of the semiconductor device or a part of the mounting board. Accordingly, it is suitable for mass production. In addition, adhesion of all of curable resin is finely broken by thermal expansion of the thermally expandable particles. Accordingly, almost no curable resin residue remains on the mounting board or the sides of the semiconductor device. Stress can thus be minimized during repair work. As a result, a new semiconductor device can be easily mounted on the mounting board again. In addition, a repaired semiconductor device can be mounted on another mounting board again. This enables the effective use without causing a loss in mounting boards and mounting components such as semiconductor devices.

In the above exemplary embodiments, thermally expandable particles are provided only on at least a part of the sides of the semiconductor device or at least a part of the surface of the mounting board around the projected area of the semiconductor device. However, thermally expandable particles may also be provided on both a part of the sides of the semiconductor device and at least a part of the surface of the mounting board around the projected area of the semiconductor device.

If thermally expandable particles with different expansion temperatures are adopted, only one side can be repaired, and then the remaining side can be repaired. This further improves re-usability of mounting boards and the semiconductor devices.

What is claimed is:

1. A method of manufacturing an electronic device, comprising steps of:
   electrically connecting a semiconductor device and a mounting board, the semiconductor device having a bottom face facing the mounting board and including a plurality of connecting terminals and a side face adjacent to the bottom face; and
   applying thermally expandable particles to the side face of the semiconductor device and a surface of the mounting board around a projected area of the semiconductor device, and then covering the thermally expandable particles with adhesive,
   wherein the thermally expandable particles are located adjacent to the side face of the semiconductor device and the surface of the mounting board around the projected area of the semiconductor device.

2. The method of manufacturing the electronic device of claim 1, wherein:
   the electrically connecting step adopts reflow soldering, and
   the thermally expandable particles are applied by injecting the thermally expandable particles together with disperse media from an injector in the applying step.

3. The method of manufacturing the electronic device of claim 2, wherein:
   the injector in the applying step has a first nozzle and a second nozzle for separately injecting the thermally expandable particles and the adhesive, the first nozzle and the second nozzle being disposed with a predetermined distance in between, and at least one of an injection pressure and injection time of the first nozzle and the second nozzle being independently controllable; and
   the thermally expandable particles are injected from the first nozzle to the side of the semiconductor device and the surface of the mounting board around the projected area of the semiconductor device, and then the adhesive is injected from the second nozzle so as to cover the thermally expandable particles.

4. The method of manufacturing the electronic device of claim 2, wherein the thermally expandable particles are dispersed in disperse media in the applying step.

5. The method of manufacturing the electronic device of claim 3, wherein a width of a rectangular tube of the second nozzle seen from a direction of movement is wider than a width of a rectangular tube of the first nozzle seen from a direction of movement, and the disperse media contains an adhesive resin component.

6. The method of manufacturing the electronic device of claim 4, wherein the disperse media contains an adhesive resin component.

7. The method of manufacturing the electronic device of claim 1, wherein:
   electrodes included on one main face of the semiconductor device and aligned with board electrodes of the mounting board are electrically connected with the board electrodes via solder bumps in the electrically connecting step; and
   the adhesive applied in the applying step is thermosetting adhesive, and is cured for bonding and fixing in a fixing step.

8. The method of manufacturing the electronic device of claim 7, wherein an expansion temperature of the thermally expandable particles is higher than a curing temperature of the adhesive and not higher than 260° C.

9. The method of manufacturing the electronic device of claim 1, wherein an expansion temperature of the thermally expandable particles is higher than a curing temperature of the adhesive.

* * * * *